(12) United States Patent
Satou et al.

(10) Patent No.: US 11,568,935 B2
(45) Date of Patent: Jan. 31, 2023

(54) SEMICONDUCTOR STORAGE DEVICE

(71) Applicant: Kioxia Corporation, Tokyo (JP)

(72) Inventors: Kazuhiko Satou, Yokohama (JP); Ryo Fukuda, Yokohama (JP); Masaru Koyanagi, Ota (JP); Kensuke Yamamoto, Yokohama (JP); Masato Dome, Yokohama (JP); Kei Shiraishi, Kawasaki (JP); Junya Matsuno, Yokohama (JP); Kenro Kubota, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 13 days.

(21) Appl. No.: 17/329,317

(22) Filed: May 25, 2021

(65) Prior Publication Data

US 2022/0059165 A1   Feb. 24, 2022

(30) Foreign Application Priority Data

Aug. 20, 2020   (JP) .............................. JP2020-139304

(51) Int. Cl.
*G11C 7/00*    (2006.01)
*G11C 16/04*   (2006.01)
*G11C 16/26*   (2006.01)
*H03K 19/00*   (2006.01)
*H03K 19/20*   (2006.01)

(52) U.S. Cl.
CPC .......... *G11C 16/0483* (2013.01); *G11C 16/26* (2013.01); *H03K 19/0005* (2013.01); *H03K 19/20* (2013.01)

(58) Field of Classification Search
CPC ....... G11C 7/1051; G11C 7/22; G11C 7/1072; G11C 7/1006; G11C 7/1066
USPC ........................................ 365/189.15, 189.14
See application file for complete search history.

(56) References Cited

U.S. PATENT DOCUMENTS

| | | | |
|---|---|---|---|
| 6,809,568 B2 | 10/2004 | Kamel et al. | |
| 2007/0043522 A1* | 2/2007 | Kobayashi | G11C 11/40626 702/57 |
| 2008/0094112 A1 | 4/2008 | Tanaka | |
| 2009/0161447 A1* | 6/2009 | Ha | G11C 7/1078 365/189.05 |
| 2018/0277223 A1 | 9/2018 | Hosoya | |
| 2019/0088294 A1 | 3/2019 | Muraoka et al. | |

FOREIGN PATENT DOCUMENTS

| | | |
|---|---|---|
| JP | 2006-140548 A | 6/2006 |
| JP | 4958719 B2 | 6/2012 |
| JP | 2018-156718 A | 10/2018 |
| JP | 2019-053656 A | 4/2019 |

\* cited by examiner

*Primary Examiner* — Son T Dinh
(74) *Attorney, Agent, or Firm* — Oblon, McClelland, Maier & Neustadt, L.L.P.

(57) ABSTRACT

A semiconductor storage device including an output pad, a first circuit connected to the output pad, a second circuit connected to the first circuit, a third circuit configured to output a first setting signal for controlling the first circuit accordance with a characteristic variation of the first circuit, and a fourth circuit configured to generate a second setting signal for controlling the second circuit in accordance with the first setting signal received from the third circuit and output the second setting signal to the second circuit.

14 Claims, 16 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2020-139304 filed on Aug. 20, 2020, the entire contents of which are incorporated herein by reference.

FIELD

Embodiments of the present disclosures relate to a semiconductor storage device.

BACKGROUND

A memory system, which includes a NAND-type flash memory as a semiconductor storage device and a controller, which controls the NAND-type flash memory, is known.

DETAILED DESCRIPTION

Figure 1:
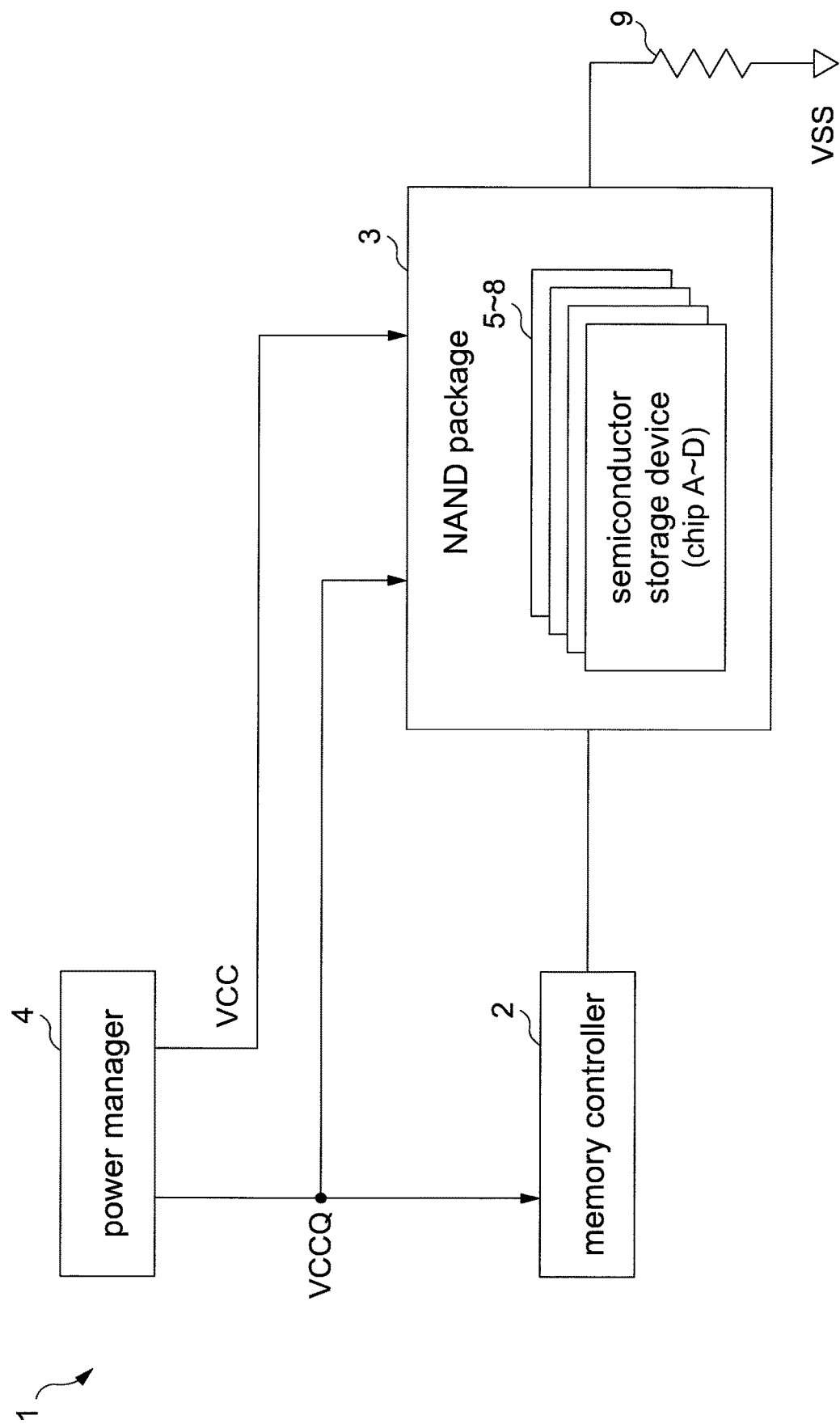
FIG. 1 is a block diagram for explaining a configuration of a power supply system of a memory system according to an embodiment.

The present invention provides a semiconductor storage device having a function of automatically changing a circuit constant internally with respect to a variation in processes.

A semiconductor storage device according to an embodiment includes:

an output pad; a first circuit connected to the output pad; a second circuit connected to the first circuit; a third circuit configured to output a first setting signal for controlling the first circuit accordance with a characteristic variation of the first circuit; and a fourth circuit configured to generate a second setting signal for controlling the second circuit in accordance with the first setting signal received from the third circuit and output the second setting signal to the second circuit.

Hereinafter, a non-volatile semiconductor storage device according to the present embodiments are described in detail by referring to the drawings. In the following description, elements having substantially the same functions and configurations are denoted by the same reference numerals and are described redundantly only when necessary. Each of the embodiments described below exemplifies a device and a method for embodying the technical idea of this embodiment. The technical idea of the embodiment is not limited as the material, shape, structure, arrangement and the like of the constituent parts described below. Various modifications may be made to the technical idea of the embodiment in addition to the scope of the claims.

Further, in the following description, signals X<n:0> ("n" is a natural number) are made up of (n+1)-bit signals, and mean a group of signals X<0>, X<1>, . . . , and X<n>, each of which is a 1-bit signal. In addition, elements Y<n:0> mean a group of elements Y<0>, Y<1>, and Y<n>, which correspond to the input or output of the signals X<n:0> in a one-to-one relationship.

In the following description, a signal BZ indicates that it is an inverted signal of a signal Z. Alternatively, when the signal Z is a control signal, the signal Z is a positive logic and the signal BZ is a negative logic. That is, the "H" level of the signal Z corresponds to assertion, and the "L" level of the signal Z corresponds to negation. The "L" level of the signal BZ corresponds to assertion, and the "H" level of the signal Z corresponds to negation.

In the following description, the notation A/B means A or B. For example, "X includes A/B, C/D and E" includes the case "X includes A, C and E" and "X includes B, D and E".

A memory system according to a first embodiment is described with reference to the FIGS. 1 to 14. The memory system according to the first embodiment includes, for example, a NAND-type flash memory as a semiconductor storage device and memory controller which controls the NAND-type flash memory.

The overall configuration of the memory system according to the first embodiment is described with reference to FIGS. 1 and 2. The memory system 1 communicates with, for example, an external host device (not illustrated). The memory system 1 holds data received from the host device and transmits data which read from the semiconductor storage devices 5 to 8 to the host device.

FIG. 1 is a diagram for explaining a power supply system of the memory system according to the first embodiment. As shown in FIG. 1, the memory system 1 includes a memory controller 2, a NAND package 3, a power manager 4 and a reference resistance 9. The NAND package 3 includes, for example, a plurality of semiconductor storage devices 5 to 8. In FIG. 1, four chips are included in the NAND package 3. In the following discussion, the semiconductor storage devices 5 to 8 may be read as chips A to D, respectively.

The power manager 4 is an integrated circuit (IC) for managing the voltage to be supplied to the memory controller 2 and the NAND package 3. The power manager 4 supplies, for example, a voltage VCCQ to the memory controller 2 and the NAND package 3. The voltage VCCQ is used as a reference of the voltage that is used for an input/output signal between the memory controller 2 and the NAND package 3. In addition, the power manager 4 supplies, for example, a voltage VCC to the NAND package 3. The voltage VCC is used as a reference voltage of other voltages used in the NAND package 3.

In addition, the NAND package 3 is connected to a voltage VSS via the reference resistor 9. The reference resistor 9 is used, for example, to calibrate an output impedance of each of the semiconductor storage devices 5 to 8 in the NAND package 3. The voltage VSS is a ground voltage, and is defined as, for example, ground (0V) in the memory system 1.

Figure 2:
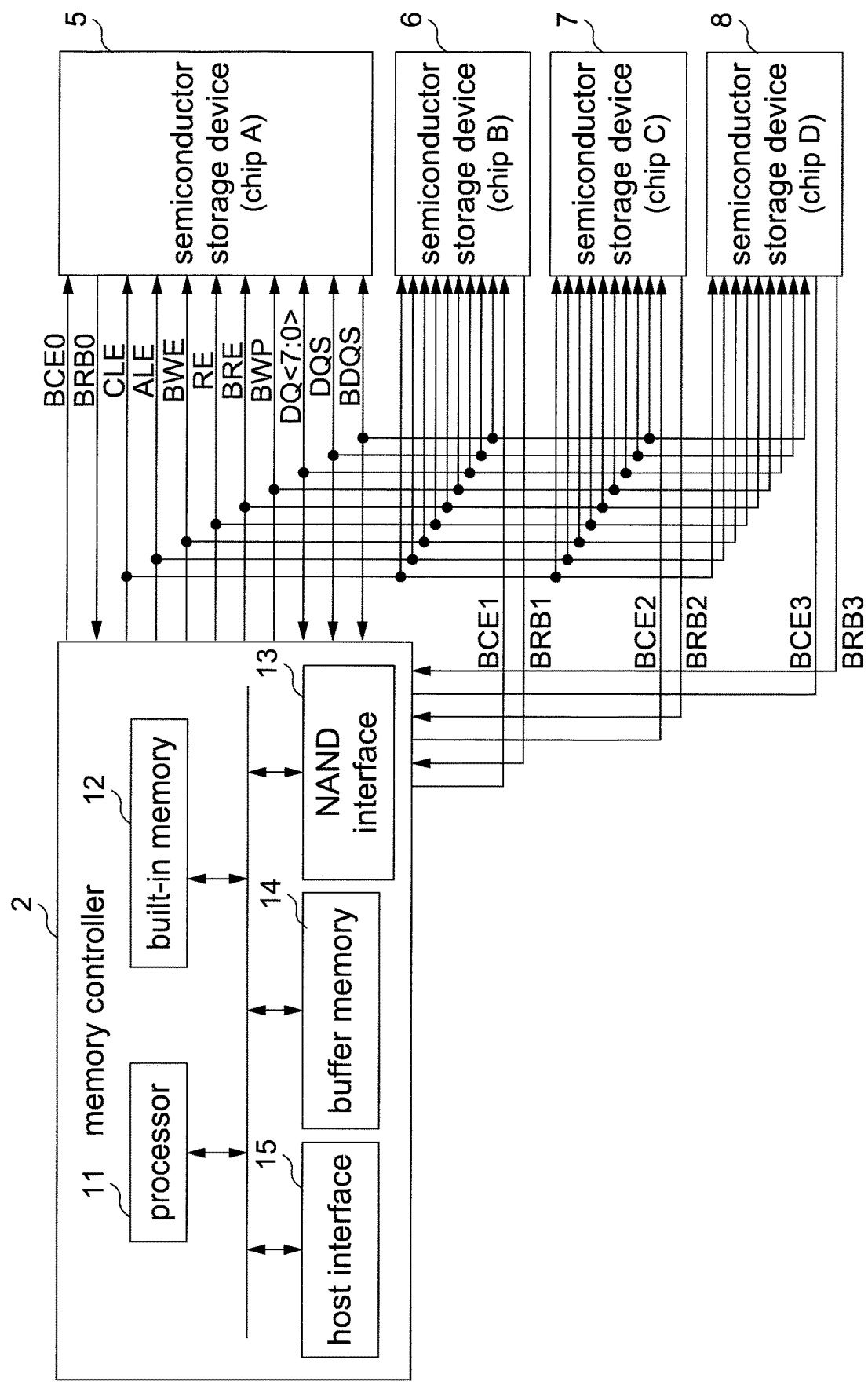
FIG. 2 is a block diagram for explaining a configuration of a signal system of a memory system according to an embodiment.

FIG. 2 is a block diagram for explaining a configuration of a signal system of a memory system according to an embodiment. As shown in FIG. 2, the memory controller 2 controls the semiconductor storage devices 5 to 8. Specifically, the memory controller 2 writes data to the semiconductor storage devices 5 to 8 and reads data from the semiconductor storage devices 5 to 8. The memory controller 2 is connected to the semiconductor storage devices 5 to 8 by a NAND bus.

Each of the semiconductor storage devices 5 to 8 includes a plurality of memory cells and stores data in a non-volatile manner. Each the semiconductor storage devices 5 to 8 is a semiconductor chip that can be uniquely identified, for example, by being supplied with an individual chip enable signal or by being pre-assigned with an individual chip address. Therefore, each of the semiconductor storage devices 5 to 8 can be operated independently according to instructions of the memory controller 2.

Similar signals are transmitted and received on the NAND bus connected to each of the semiconductor storage devices 5 to 8. The NAND bus includes a plurality of signal lines to transmit and receive signals according to a NAND interface. BCE is a chip enable signal and operates with negative logic. BRB is a ready busy signal and operates in negative logic. CLE is a command latch enable signal and operates in positive logic. ALE is an address latch enable signal and operates in positive logic. BWE is a write enable signal and operates in negative logic. RE and BRE are read enable signals and inverted signals of them. The RE operates in positive logic. The BRE operates in negative logic. For example, the RE and/or BRE function as output instruction signals. BWP is a write protect signal and operates in negative logic.

DQ<7:0> is a data signal. The data signal DQ<7:0> is input and output via the input/output terminal (I/O port). Signals DQS and BDQS are a data strobe signal and an inverted signal of the data strobe signal. For example, the DQS and/or the BDQS function as the strobe signal or a timing control signal. The strobe signal (DQS/BDQS) is a signal pair having opposite phases. The strobe signal is a signal defining timing of transmitting and receiving the data signal DQ<7:0>. Signals BCE0 to BCE3 are transmitted from the memory controller 2 to each of the storage devices 5 to 8 independently. Signals BRB0 to BRB3 are transmitted independently from each of the semiconductor storage devices 5 to 8 to the memory controller 2. The signals CLE, ALE, BWE, RE, BRE and BWP are commonly transmitted from the memory controller 2 to the semiconductor storage devices 5 to 8.

The signals BCE0 to BCE3 are signals for enabling the semiconductor storage devices 5 to 8, respectively. The signal CLE notifies the semiconductor storage devices 5 to 8 that the data signals DQ<7:0> flowing to the semiconductor storage devices 5 to 8 are commands while the signal CLE is at the "high (H)" level. The signal ALE notifies the semiconductor storage devices 5 to 8 that the data signals DQ<7:0> flowing to the semiconductor storage devices 5 to 8 are addresses while the signal ALE is at the "H" level. The signal BWE instructs the semiconductor storage devices 5 to 8 to write the data signals DQ<7:0> flowing to the semiconductor storage devices 5 to 8 while the signal BWE is at the "low (L)" level.

The signals RE and BRE instruct the semiconductor storage devices 5 to 8 to output the data signals DQ<7:0>, and for example, are used to control the operation timing of the semiconductor storage devices 5 to 8 when outputting the data signals DQ<7:0>. The signal BWP instructs the semiconductor storage devices 5 to 8 to prohibit data writing and erasing. The signals BRB0 to BRB3 respectively indicate whether the semiconductor storage devices 5 to 8 are in a ready state (a state of accepting a command from the outside) or in a busy state (a state of not accepting a command from the outside).

The data signals DQ<7:0> are, for example, 8-bit signals. The data signals DQ<7:0> are transmitted and received between the semiconductor storage devices 5 to 8 and the memory controller 2, and include commands, addresses, and data. The signals DQS and BDQS may be generated, for example, based on the signals RE and BRE, and are used to control the operation timing of the semiconductor storage devices 5 to 8 in response to the data signals DQ<7:0>.

The memory controller 2 includes a processor (central processing unit (CPU)) 11, a built-in memory (random access memory (RAM)) 12, a NAND interface circuit 13, a buffer memory 14 and a host interface circuit 15.

The processor 11 controls the overall operation of the memory controller 2. The processor 11 issues, for example, a write command based on a NAND interface to the semiconductor storage devices 5 to 8 in response to a write command of data received from the outside. This function is equally applied to other operations such as, for example, read, erasing and calibration operations.

The built-in memory 12 is, for example, a semiconductor memory such as, for example, dynamic RAM (DRAM), and is used as a work area of the processor 11. The built-in memory 12 holds, for example, firmware and various management tables for managing the semiconductor storage devices 5 to 8.

The NAND interface circuit 13 is connected to the semiconductor storage devices 5 to 8 via the above-described NAND bus, and executes communication with the semiconductor storage devices 5 to 8. The NAND interface circuit 13 transmits commands, addresses, and write data to the semiconductor storage devices 5 to 8 in response to an instruction of the processor 11. In addition, the NAND interface circuit 13 receives statuses and read data from the semiconductor storage devices 5 to 8.

The buffer memory 14 temporarily holds, for example, data received by the memory controller 2 from the semiconductor storage devices 5 to 8 and the outside.

The host interface circuit 15 is connected to an external host device (not illustrated), and executes communication with the host device. The host interface circuit 15 transfers, for example, commands and data, received from the host device, to the processor 11 and the buffer memory 14, respectively.

[Configuration of the Semiconductor Storage Device]

The configuration of the semiconductor storage device according to the first embodiment is described with reference to FIG. 3. The semiconductor storage devices 5 to 8 have, for example, the same configuration. Therefore, in the following description, a configuration of the semiconductor storage device 5, among the semiconductor storage devices 5 to 8, is described, and a description related to a configuration of the semiconductor storage devices 6 to 8 is omitted.

Figure 3:
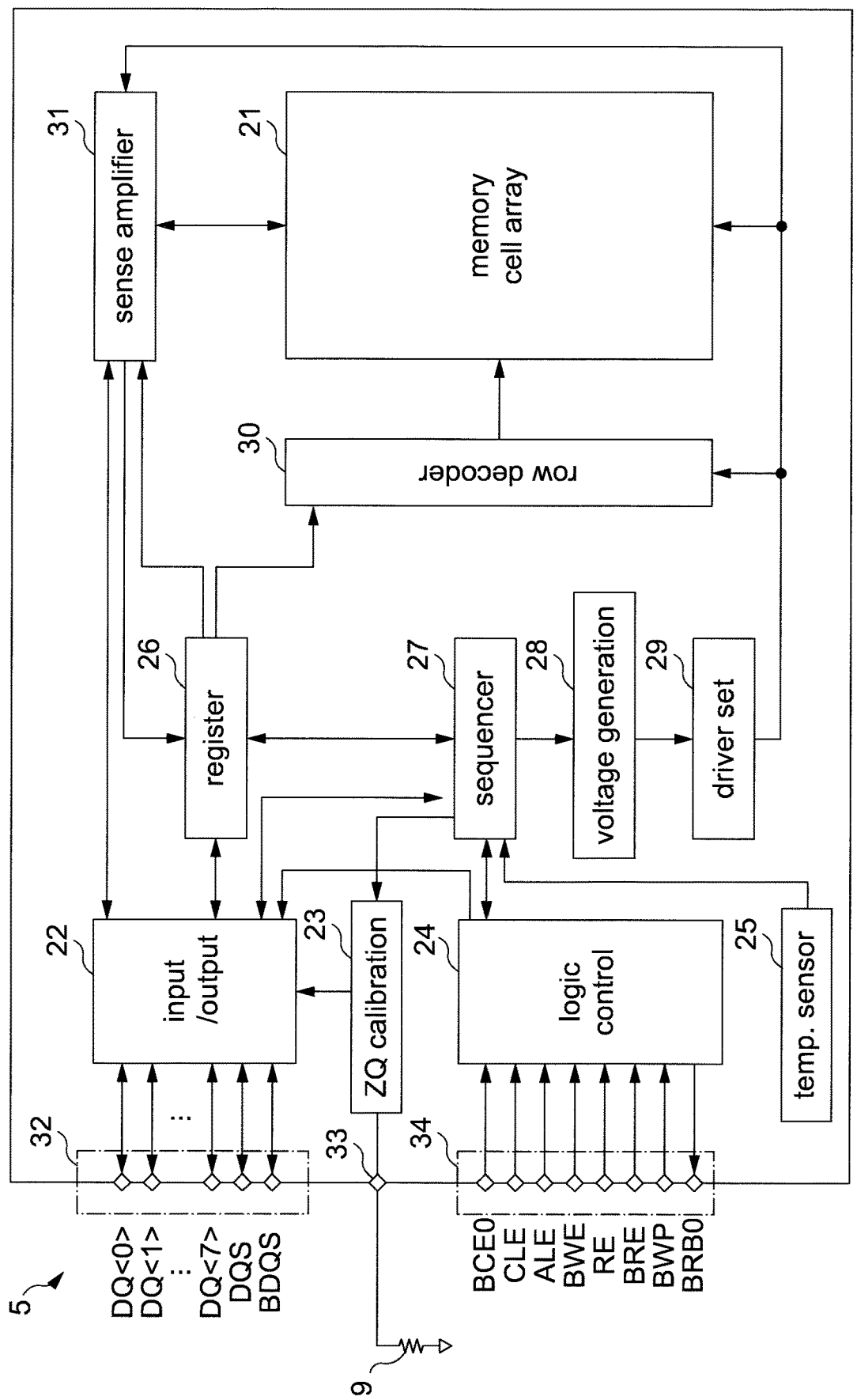
FIG. 3 is a block diagram for explaining a configuration of a semiconductor storage device according to an embodiment.

As illustrated in FIG. 3, the semiconductor storage device 5 includes a memory cell array 21, an input/output circuit 22, a ZQ calibration circuit 23, a logic control circuit 24, a temperature sensor 25 (temp. sensor), a register 26, a sequencer 27, a voltage generation circuit 28, a driver set 29, a row decoder 30, a sense amplifier 31, an input/output pad group 32, a ZQ calibration pad 33 and a logic-control pad group 34.

The memory cell array 21 includes a plurality of non-volatile memory cells (not illustrated) associated with word lines and bit lines.

The input/output circuit 22 transmits and receives the data signals DQ<7:0> to and from the memory controller 2. The input/output circuit 22 transfers commands and addresses in the data signals DQ<7:0> to the register 26. The input/output circuit 22 transmits and receives write data and read data to and from the sense amplifier 31.

The ZQ calibration circuit 23 calibrates the output impedance of the semiconductor storage device 5 based on the reference resistor 9 via the ZQ calibration pad 33.

The logic control circuit 24 receives the signals BCE0, CLE, ALE, BWE, RE, BRE and BWP from the memory controller 2. In addition, the logic control circuit 24 transfers the signal BRB0 to the memory controller 2 and notifies the state of the semiconductor storage device 5 to the outside.

The temperature sensor 25 measures the temperature inside the semiconductor storage device 5. The temperature sensor 25 sends information on the measured temperature to the sequencer 27. Further, the temperature sensor 25 may be provided at any position in the semiconductor storage device 5 in a range within which it may measure the temperature that may be regarded as the temperature of the memory cell array 21.

The register 26 holds commands and addresses. The register 26 transfers the addresses to the row decoder 30 and the sense amplifier 31, and transfers the commands to the sequencer 27.

The sequencer 27 receives the commands, and controls the entire semiconductor storage device 5 according to the sequence based on the received commands. In addition, the sequencer 27 sends information on the temperature, received from the temperature sensor 25, to the memory controller 2 via the input/output circuit 22.

The voltage generation circuit 28 generates voltages required for operations such as, for example, data writing, reading and erasing based on an instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the addresses from the register 26. The driver set 29 supplies various voltages to the row decoder 30 based on, for example, a row address among the addresses.

The row decoder 30 receives the row address, among the addresses, from the register 26, and selects the memory cells in the row based on the row address. Then, the voltages from the driver set 29 are transferred to the memory cells in the selected row via the row decoder 30.

At the time of reading data, the sense amplifier 31 senses read data that are read from the memory cells to the bit lines, and transfers the sensed read data to the input/output circuit 22. At the time of writing data, the sense amplifier 31 transfers write data via the bit lines to the memory cells. In addition, the sense amplifier 31 receives a column address, among the addresses, from the register 26, and outputs column data based on the column address.

The input/output pad group 32 transfers the data signal DQ<7:0>, the signal DQS and the signal BDQS, received from the memory controller 2, to the input/output circuit 22. In addition, the input/output pad group 32 transfers the data signal DQ<7:0>, transmitted from the input/output circuit 22, to the outside of the semiconductor storage device 5.

The ZQ calibration pad 33 is connected at one end thereof to the reference resistor 9 and at the other end thereof to the ZQ calibration circuit 23.

The logic control pad group 34 transfers signals BCE0, CLE, ALE, BWE, RE, BRE and BWP received from the memory controller 2 to the logic control circuit 24. The logic control pad group 34 transfers BRB0 transmitted from the logic control circuit 24 to the external of the semiconductor storage device 5.

[Configuration of Input/Output Circuits]

Figure 4:
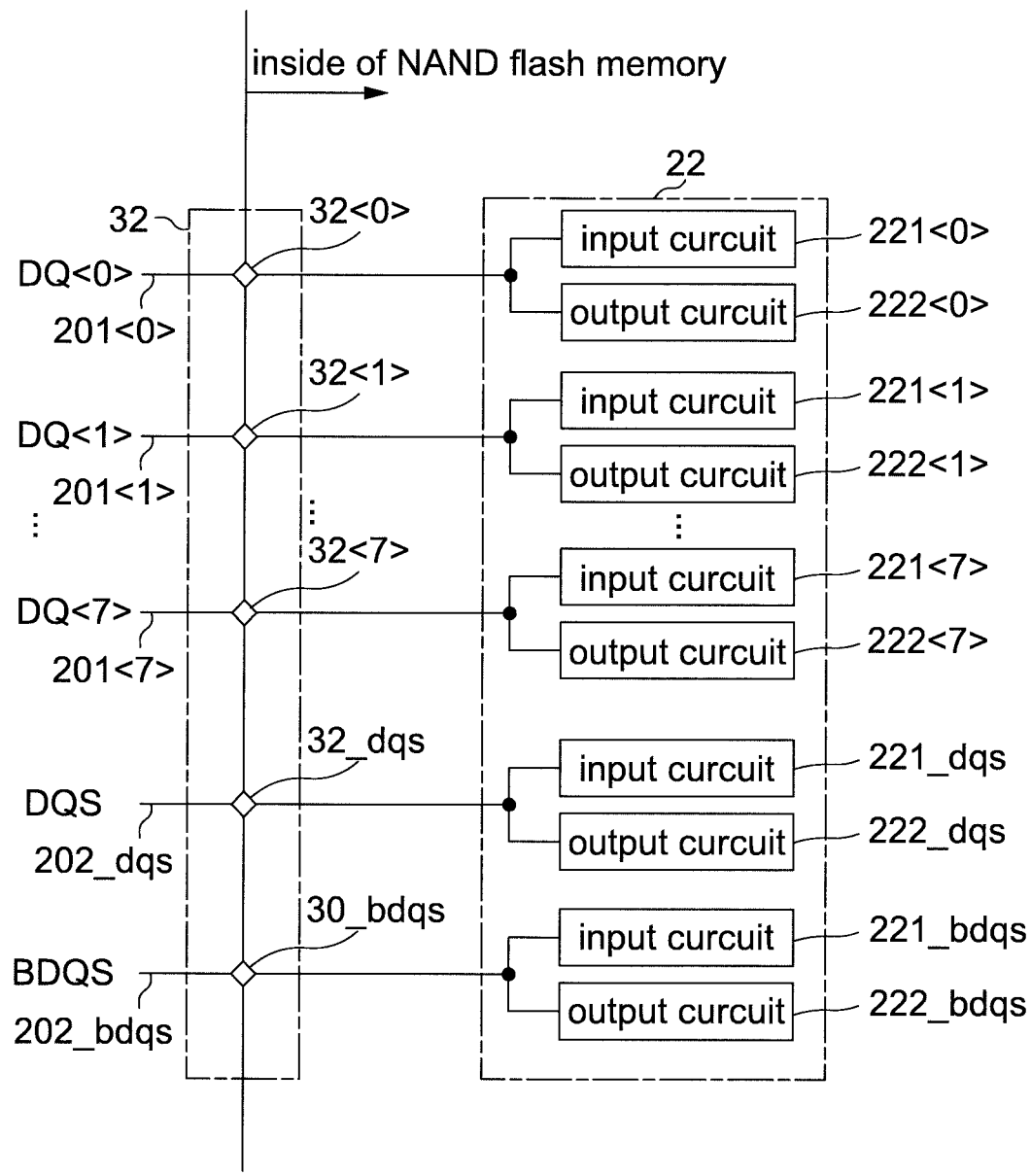
FIG. 4 is a block diagram for explaining a configuration of input/output circuits of a semiconductor storage device according to an embodiment.

A configuration of the input/output circuits of the semiconductor storage device according to the first embodiment will be described with reference to FIG. 4. FIG. 4 is a block diagram for explaining a configuration of the input/outputs circuit of the semiconductor storage device according to an embodiment.

As shown in FIG. 4, the input/output circuit 22 includes a set of input circuits 221<0> to 221<7> and output circuits 222<0> to 222<7> corresponding to the data signals DQ<0> to DQ<7>. For one set of the input circuit 221<k> and the output circuit 222<k>, for example, the same type of data signal DQ<k> is allocated (0≤k≤7). A set of the input circuit 221<k> and the output circuit 222<k> is connected to a pad 32<k> in the input/output pad group 32. The pad 32 can transmit and receive the data signal DQ<K> to and from the external memory controller 2 via a signal line 201<k>. As described above, a plurality of sets of the input circuit 221 and the output circuit 222, a plurality of the pads 32, and a plurality of the signal lines 201 are provided, respectively.

The input/output circuit 22 includes a set of an input circuit 221_dqs and an output circuit 222_dqs corresponding to the signal DQS. The set of the input circuit 221_dqs and the output circuit 222_dqs is connected to a pad 32_dqs in the input/output pad group 32. The pad 32_dqs can communicate the signal DQS to the external memory controller 2 via a signal line 202_dqs. The input/output circuit 22 includes a set of an input circuit 221_bdqs and an output circuit 222_bdqs corresponding to the signal BDQS. The set of the input circuit 221_bdqs and the output circuit 222_bdqs is connected to a pad 32_bdqs in the input/output pad group 32. The pad 32_bdqs can communicate the signal BDQS to the external memory controller 2 via a signal line 202_bdqs.

[Configuration of Output Circuit]

Figure 5:
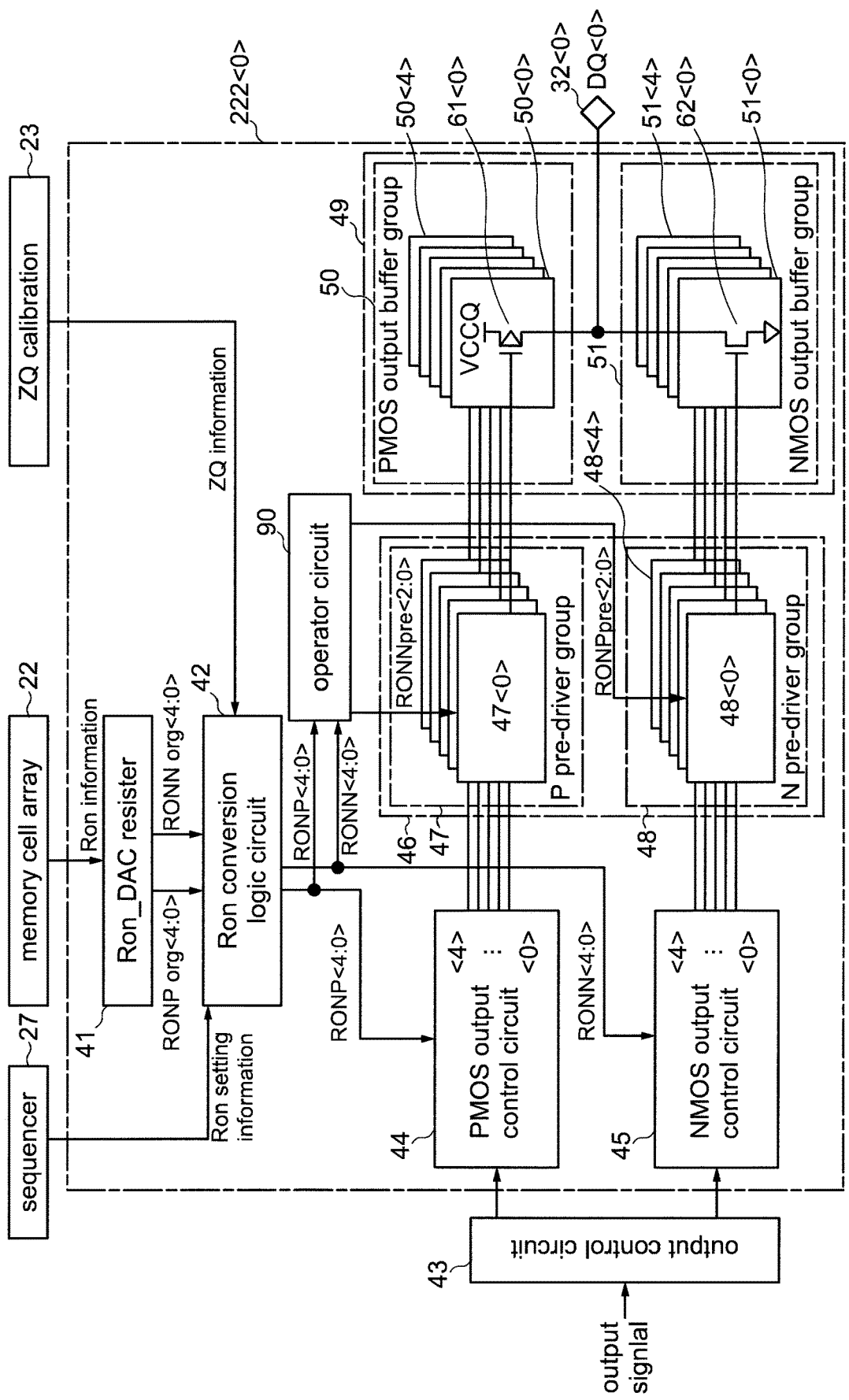
FIG. 5 is a block diagram for explaining a configuration of an output circuit of a semiconductor storage device according to an embodiment.

A configuration of the output circuit of the semiconductor storage device according to the first embodiment will be described with reference to FIG. 5. FIG. 5 is a block diagram for explaining a configuration of the output circuit of the semiconductor storage device according to an embodiment.

In the example of FIG. 5, the output circuit 222<0> corresponding to the input/output pad 32<0> is described. The signal DQ<0> is provided to the input/output pad 32<0>. Configurations of the other output circuits 222<k>, 222_dqs and 222_bdqs are also the same as the configuration shown in FIG. 5. In the example of FIG. 5, Ron information is stored in the memory cell array 21. The output circuit 222<0> operates by reflecting ZQ information to the Ron information. However, the configuration of the present embodiment is not limited to the above configuration. The ZQ calibration circuit 23 and the ZQ information may be omitted.

As shown in FIG. 5, the output circuit 222<0> includes an Ron_DAC register 41, an Ron conversion logic circuit 42, an output control circuit 43, a PMOS output control circuit 44, an NMOS output control circuit 45, a pre-driver 46 and an output buffer 49.

The pre-driver 46 transmits a voltage based on the output signal to the output buffer 49. The pre-driver 46 includes a P pre-driver group 47 and an N pre-driver group 48. The P pre-driver group 47 includes five P pre-drivers 47<4:0>. In the following description, the P pre-driver corresponding to a first setting signal RONP<m> (m is an integer of 0≤m≤4) described later is referred to as the P pre-driver 47<m>. The N pre-driver group 48 includes five N pre-drivers 48<4:0>. In the following description, the N pre-driver corresponding to a first setting signal RONN described later is referred to as the N pre-driver 48<m>.

The output buffer 49 includes a PMOS output buffer group 50 and an NMOS output buffer group 51. The PMOS output buffer group 50 includes five PMOS output buffers 50<4:0>. In the following description, the PMOS output buffer corresponding to the P pre-driver 47<m> is referred to as the PMOS output buffer 50<m>. The NMOS output buffer group 51 includes five NMOS output buffers 51<4:0>. In the following description, the NMOS output buffer corresponding to the N pre-driver 48<m> is referred to as an NMOS output buffer 51<m>.

The control signal for controlling the above circuit is composed of a 5-bit signal represented by <4:0>. However, the number of the output buffers and the number of the bits of the control signal are merely examples and are not limited to the numerical values described above.

The Ron_DAC register 41 temporarily stores the Ron information stored in the memory cell array 21. After the power supply of the semiconductor storage device 5 (refer to FIG. 2) is turned on, for example, the sequencer 27 stores the Ron information in the Ron_DAC register 41 as one of POR operation. Specifically, a signal RONPorg<4:0> and a signal RONNorg<4:0> are stored in the Ron_DAC register 41 as the Ron information. The signal RONPorg<4:0> is the 5-bit signal for controlling the transistor size constituted by the entire PMOS output buffer group 50 to be described later. The PMOS output buffer group 50 is composed of transistors (hereinafter referred to as "MOS transistors") of the PMOS output buffer 50<4:0>. The signal RONNorg<4:0> is the 5-bit signal for controlling the transistor size constituted by the entire NMOS output buffer group 51 to be described later. The NMOS output buffer group 51 is composed of the MOS transistors of the NMOS output buffer 51<4:0>. The signal RONPorg<4:0> and the signal RON Norg<4:0> are transmitted from the Ron_DAC register 41 to the Ron conversion logic circuit 42.

For example, the Ron conversion logic circuit 42 converts the signal RONPorg<4:0> received from the Ron_DAC register 41 and generates the first setting signal RONP<4:0> according to Ron set value information received from the sequencer 27 and the ZQ information received from the ZQ calibration circuit 23. The Ron conversion logic circuit 42 transmits the first setting signal RONP<4:0> to the PMOS output control circuit 44 and a calculation circuit 90. Based on the first setting signal RONP<4:0>, the PMOS output control circuit 44 controls on-resistance of the transistor constituted by the entire PMOS output buffer group 50. Specifically, based on the first setting signal RONP<4:0>, the PMOS output control circuit 44 selects the PMOS output buffer 50 to be operation from among the PMOS output buffer 50<4:0> included in the PMOS output buffer group 50. In other words, the first setting signal RONP<4:0> is a signal controlling the output of the PMOS output buffer group 50 according to the characteristic variation of the MOS transistor provided in the PMOS output buffer group 50.

The calculation circuit 90 generates a second setting signal RONNpre<2:0> based on the first setting signal RONN<4:0> and transmits the second setting signal RON-Npre<2:0> to the P pre-driver 47<4:0>. As will be described in detail later, the P pre-driver 47<m> includes three NMOS transistors (hereinafter referred to as "variable resistance transistors") connected in parallel for adjusting slew rate of the PMOS output buffer 50<m>. Therefore, a control signal for controlling the variable resistance transistors is composed of a 3-bit signal represented by <2:0>. The transistor size of each of the above three NMOS transistors connected in parallel is different.

Similar to the above, the Ron conversion logic circuit 42 converts the signal RONNorg<4:0> received from the Ron_DAC register 41 and generates the first setting signal RON N<4:0> according to the Ron set value information received from the sequencer 27 and the ZQ information relating to the NMOS transistor received from the calibration circuit 23. The Ron conversion logic circuit 42 transmits the first setting signal RONN<4:0> to the NMOS output control circuit 45 and the calculation circuit 90. The NMOS output control circuit 45 controls on-resistance of the transistor constituted by the entire NMOS output buffer group 51 based on the first setting signal RONN<4:0>. Specifically, based on the first setting signal RONN<4:0>, the NMOS output control circuit 45 selects the NMOS output buffer 51 to be operation from among the NMOS output buffer 51<4:0> included in the NMOS output buffer group 51. In other words, the first setting signal RONN<4:0> is a signal controlling the output of the NMOS output buffer group 51 according to the characteristic variation of the MOS transistor provided in the NMOS output buffer group 51.

The calculation circuit 90 generates a second setting signal RONPpre<2:0> based on the first setting signal RONP<4:0> and transmits the second setting signal RONPpre<2:0> to the N pre-driver 48<4:0>. Similar to the above, the N pre-driver 48<m> includes three PMOS transistors (hereinafter referred to as "variable resistance transistors") connected in parallel for adjusting slew rate of the NMOS output buffer 51<m>. Therefore, a control signal for controlling the variable resistance transistors is composed of a 3-bit signal represented by <2:0>. Although described later in detail, the transistor size of each of the above three PMOS transistors connected in parallel is different.

The output control circuit 43 transmits, for example, an output signal received from the register 26 in the semiconductor storage device 5 to the PMOS output control circuit 44 and the NMOS output control circuit 45.

The PMOS output control circuit 44 is connected to the P pre-drivers 47<0> to 47<4> of the P pre-driver group 47 via five signal lines corresponding to each bit of the first setting signal RONP<4:0>. The PMOS output control circuit 44 transmits the output signal received from the output control circuit 43 to the P pre-driver 47 group via the signal line selected based on the first setting signal RONP<4:0>. That is, the PMOS output control circuit 44 selects a path of the signal line at which the output signal is transmitted to the P pre-driver 47 group based on the first setting signal RONP<4:0>. For example, in each bit of the first setting signal RONP<4:0>, the PMOS output control circuit 44 selects the corresponding signal line when the data is "1" and deselects the corresponding signal line when the data is "0". For example, when the first setting signal RONP<4:0> is "11001", the PMOS output control circuit 44 transmits the output signal to the P pre-driver 47<4>, 47<3> and 47<0>. That is, the larger the value of the first setting signal RONP<4:0>, the lower the resistance value of the PMOS output buffer 50<4:0> selected by the P pre-driver 47<4:0>.

Similar to the PMOS output control circuit 44, the NMOS output control circuit 45 is connected to the N pre-drivers 48<0> to 48<4> of the N pre-driver group 48 via five signal lines corresponding to each bit of the first setting signal RONN<4:0>. The NMOS output control circuit 45 transmits the output signal received from the output control circuit 43 to the N pre-driver group 48 via the signal line selected based on the first setting signal RONN<4:0>. That is, the NMOS output control circuit 45 selects the path of the signal line at which the output signal is transmitted to the N pre-driver 48 group based on the first setting signal RONN<4:0>.

The P pre-driver group 47 outputs an inverted signal of the output signal to the PMOS output buffer group 50. The P pre-driver group 47 has five P pre-drivers 47<0> to 47<4> corresponding to each bit of the first setting signal RONP<4:0>. The configurations of each of the five P pre-drivers 47<0> to 47<4> are the same. Based on the first setting signal RONP<m> received from the PMOS output control circuit 44, operation or non-operation of the P pre-driver 47<m> is determined. Based on the second setting signal RONNpre<n> (n is an integer of (0≤n≤2) received from the calculation circuit 90, operations or non-operations of the three variable resistance transistors provided in the P pre-driver 47<m> are determined. In other words, based on the second setting signal RONNpre<n>, the transistor size of the variable resistance transistors in the P pre-driver 47<m> is changed. The configuration of the P pre-driver 47 will be described later.

The N pre-driver group 48 outputs an inverted signal of the output signal to the NMOS output buffer group 51. The N pre-driver group 48 has five N pre-drivers 48<0> to 48<4> corresponding to each bit of the first setting signal RONN<4:0>. The configurations of each of the five N pre-drivers 48<0> to 47<4> are the same. Based on the first setting signal RONN<m> received from the NMOS output control circuit 45, operation or non-operation of the N pre-driver 48<m> is determined. Based on the second setting signal RONPpre<n> received from the calculation circuit 90, operations or non-operations of the three variable resistance transistors provided in the N pre-driver 48<m>
are determined. In other words, based on the second setting signal RONPpre<n>, the transistor size of the variable resistance transistors in the N pre-driver 48<m> is changed. The configuration of the N pre-driver 48 will be described later.

The output buffer 49 converts the output signal to an appropriate voltage level, and outputs the output signal to a controller 200 via the pad 32<0>. The output buffer 49 includes the PMOS output buffer group 50 and the NMOS output buffer group 51.

When the output signal of the P pre-driver group 47 is "L" level, the PMOS output buffer group 50 outputs a supply voltage VCCQ of "H" level to the pad 32<0>. The PMOS output buffer group 50 includes the five PMOS output buffers 50<0> to 50<4> connected to each of the five P pre-drivers 47<0> to 47<4>.

The PMOS of the output buffers 50<0> to 50<4> include PMOS transistors 61<0> to 61<4>, respectively. The PMOS transistor provided in the PMOS output buffer 50<m> is referred to as the PMOS transistor 61<m>. A gate of the transistor 61<m> is connected to the corresponding P pre-driver 47<m>. The voltage VCCQ is applied to a source of the transistor 61<m>. A drain of the transistor 61<m> is connected to pad 32<0>.

Each of the five transistors 61<0> to 61<4> may have the same transistor size (on-resistance) or may be different. When the transistor size is different, for example, on-resistances of the transistors 61<0> to 61<4> may have a relationship of (61<0>)>(61<1>)> . . . >(61<4>). By combining the transistors 61<0> to 61<4>, the transistor size (combined on-resistance) of the PMOS transistor 61 in the PMOS output buffer group 50 is adjusted in $2^5=32$ ways. That is, based on the first setting signal RONP<4:0>, output-impedance of the PMOS transistor is selected from 32 ways. Each output-waveform of the transistor 61<m> is adjusted by the output of the P pre-driver 47<m>. That is, the output-waveform of each of the transistor 61<m> is adjusted by the transistor size of the NMOS transistor in the P pre-driver 47<m>.

When the output signal of the N pre-driver group 48 is "H" level, the NMOS output buffer group 51 outputs an "L" level voltage (a ground voltage VSS) to the pad 32<0>. The NMOS output buffer group 51 includes the five NMOS output buffers 51<0> to 51<4> connected to each of the five N pre-drivers 48<0> to 48<4>.

The NMOS output buffers 51<0> to 51<4> include NMOS transistors 62<0> to 62<4>, respectively. The NMOS transistor provided in the NMOS output buffer 51<m> is referred to as an NMOS transistor 62<m>. A gate of the transistor 62<m> is connected to the corresponding N pre-driver 48<m>. A source of the transistor 62<m> is grounded (the voltage VSS is applied). A drain of the transistor 62<m> is connected to the pad 32<0>.

Each of the five transistors 62<0> to 62<4> may be the same transistor size (on-resistance) or may be different transistor size (on-resistance). When the transistors sizes are different, for example, on-resistances of the transistors 62<0> to 62<4> may have a relationship of (62<0>)>(62<1>)> . . . >(62<4>). By combining the transistors 62<0> to 62<4>, the transistor size (combined on-resistance) of the NMOS transistor 62 in the NMOS output buffer group 51 is adjusted in $2^5=32$ ways. That is, based on the signal RONN<4:0>, output-impedance of the NMOS transistor is selected from 32 ways. Each output-waveform of the transistor 62<m> is adjusted by the output of the N pre-driver 48<m>. That is, the output-waveform of each of the transistor 62<m> is adjusted by the transistor size of the PMOS transistor in the N pre-driver 48<m>.

Referring to FIGS. 6 to 11, detailed configurations of the PMOS output control circuit 44, the NMOS output control circuit 45, the P pre-driver 47, the N pre-driver 48, the PMOS output buffer 50 and the NMOS output buffer 51 and the input/output of the signals between the respective circuits will be described. In the following description, the output circuit 222<0> will be described, but the configurations of the other output circuits 222<k>, 222_dqs and 222_bdqs are the same as those shown in FIGS. 6 to 11.

Figure 6:
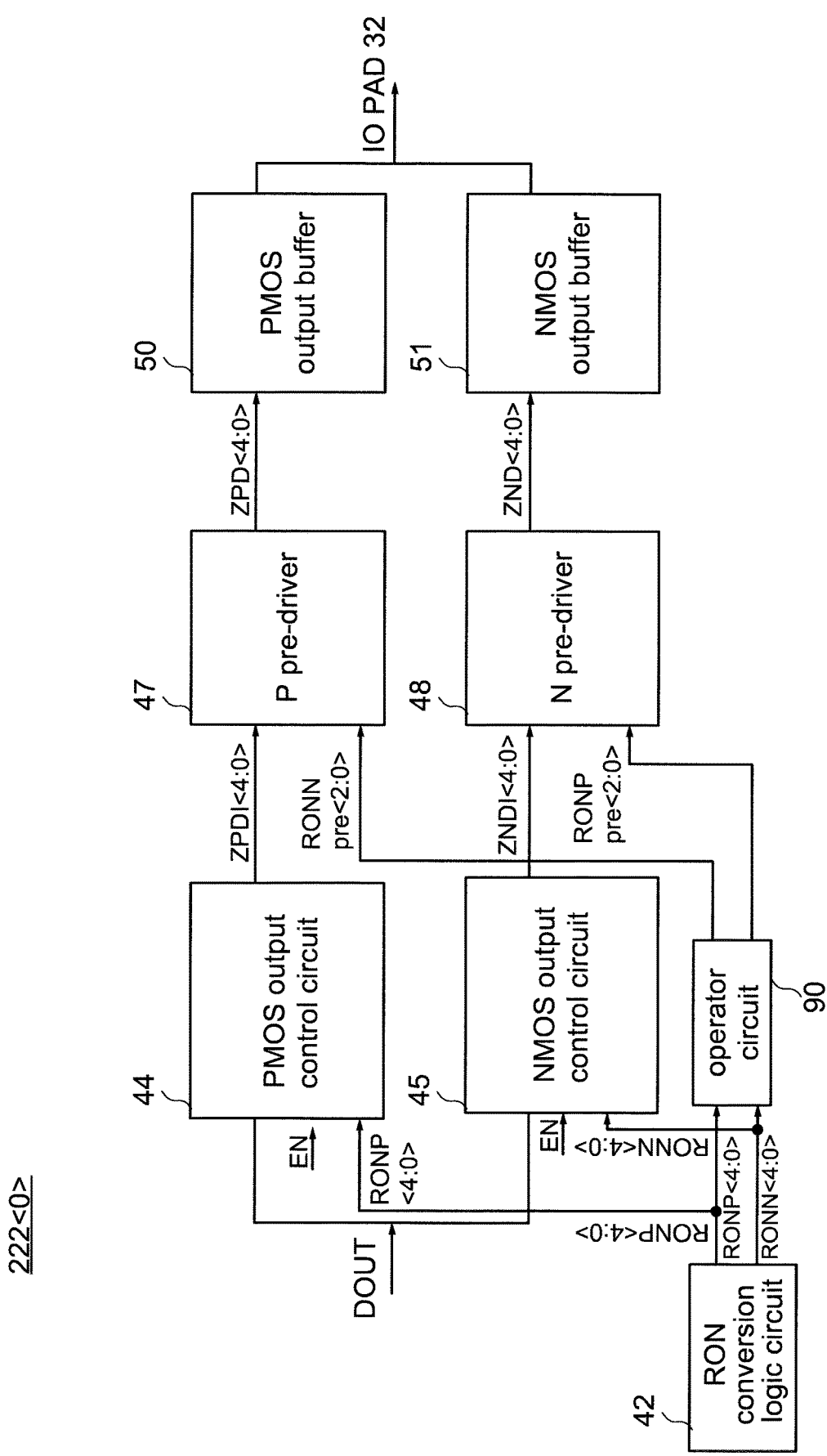
FIG. 6 is a block diagram for explaining input/output signals to each circuit included in an output circuit of a semiconductor storage device according to an embodiment.

FIG. 6 is a block diagram for explaining the input/output signals to the respective circuits included in the output circuit of the semiconductor storage device according to an embodiment. The first setting signal RONP<4:0> output from the Ron conversion logic circuit is input to the PMOS output control circuit 44<4:0> and the calculation circuit 90. Similarly, the first setting signal RONN<4:0> output from the Ron conversion logic circuit 42 is input to the NMOS output control circuit 45<4:0> and the calculation circuit 90. The calculation circuit 90 generates the second setting signal RONNpre<2:0> based on the input first setting signal RONN<4:0> and outputs the second setting signal RONNpre<2:0> to the P pre-driver 47<4:0>. Similarly, the calculation circuit 90 generates the second setting signal RONPpre<2:0> based on the input first setting signal RONP<4:0> and outputs the second setting signal RONPpre<2:0> to the N pre-driver 48<4:0>. An output signal DOUT and a control signal EN are input to the PMOS output control circuit 44<4:0> and the NMOS output control circuit 45<4:0>, respectively.

The pad 32 may be referred to as an "output pad (IO pad)". The PMOS output buffer 50 and the NMOS output buffer 51 may be referred to as a "first circuit". The P pre-driver 47 and the N pre-driver 48 may be referred to as a "second circuit". The Ron conversion logic circuit 42 may be referred to as a "third circuit". The calculation circuit 90 may be referred to as a "fourth circuit". The PMOS output control circuit 44 and the NMOS output control circuit 45 may be referred to as a "fifth circuit". The output signal DOUT may be referred to as a "output-subject data". The control signal EN may be referred to as a timing control signal. The fifth circuit are driven in accordance with data read out from memory cells in the memory cell array 21.

As described above, the semiconductor storage device 5 according to the first embodiment includes the pad 32 (the 10 pad), the PMOS output buffer 50/the NMOS output buffer 51 (the first circuit), the P pre-driver 47/the N pre-driver 48 (the second circuit), the Ron conversion logic circuit 42 (the third circuit) and the calculation circuit 90 (the fourth circuit). The PMOS output buffer 50/the NMOS output buffer 51 are connected to the pad 32. The P pre-driver 47/the N pre-driver 48 are connected to the PMOS output buffer 50/the NMOS output buffer 51. The Ron conversion logic circuit 42 outputs the first setting signal RONP/the first setting signal RONN. The first setting signal RONP/the first setting signal RONN are parameters for controlling the output buffers of the PMOS output buffer 50 and the NMOS output buffer 51 according to the characteristic variation of these output buffers. The calculation circuit 90 generates and outputs the second setting signal RONPpre/the second setting signal RONNpre based on the first setting signal RONP/the first setting signal RONN received from the Ron conversion logic circuit 42. The second setting signal RONNpre is a parameter for controlling the P pre-driver 47. The second setting signal RONPpre is a parameter for controlling the N pre-driver 48. The P pre-driver 47/the N pre-driver 48 control the PMOS output buffer 50/the NMOS output buffer 51.

Figure 7:
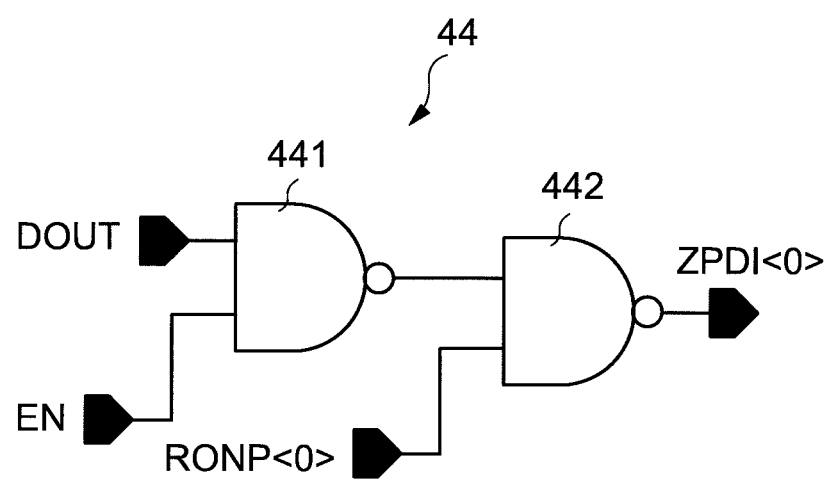
FIG. 7 is a block diagram for explaining a configuration of a PMOS output control circuit constituting an output circuit of a semiconductor storage device according to an embodiment.

FIG. 7 is a block diagram for explaining a configuration of the PMOS output control circuit constituting the output circuit of the semiconductor storage device according to an embodiment. In the following example, a configuration in which the PMOS output control circuit 44 is connected to the P pre-driver 47<0> will be described. However, the PMOS output control circuit 44 is also connected to the other P pre-driver 47<m>. As shown in FIG. 7, the PMOS output control circuit 44 has a first calculation circuit 441 and the second calculation circuit 442. In the example of FIG. 7, NAND circuits are used as these calculation circuits. The output signal DOUT and the control signal EN are input to an input terminal of the first calculation circuit 441. The output of the first calculation circuit 441 and the first setting signal RONP<0> are input to an input terminal of the second calculation circuit 442. From an output terminal of the second calculation circuit 442, a signal ZPDI<0> is output as the output signal of the PMOS output control circuit 44. As shown in FIG. 6, the signal ZPDI<4:0> is input to the P pre-driver 47<4:0>. The signal ZPDI<4:0> may be referred to as a drive signal to drive the P pre-driver 47<4:0>. The first calculation circuit 441 may be referred to as a first NAND gate. The second calculation circuit 442 may be referred to as a second NAND gate.

Figure 8:
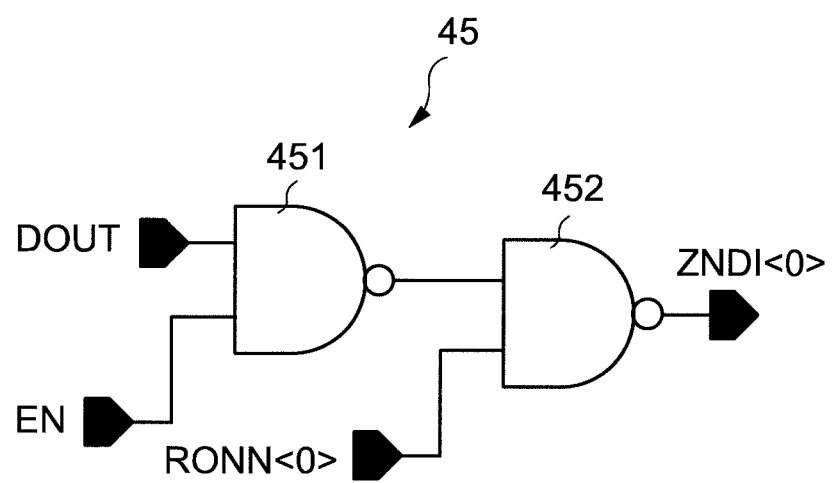
FIG. 8 is a block diagram for explaining a configuration of an NMOS output control circuit constituting an output circuit of a semiconductor storage device according to an embodiment.

FIG. 8 is a block diagram for explaining a configuration of the NMOS output control circuit constituting the output circuit of the semiconductor storage device according to an embodiment. In the following example, a configuration in which the NMOS output control circuit 45 is connected to the N pre-driver 48<0> will be described. However, the NMOS output control circuit 45 is also connected to the other N pre-driver circuit 48<m>. As shown in FIG. 8, the NMOS output control circuit 45 has a first calculation circuit 451 and a second calculation circuit 452. In the example of FIG. 8, NAND circuits are used as these calculation circuits. The output signal DOUT and the control signal EN are input to an input terminal of the first calculation circuit 451. The output of the first calculation circuit 451 and the first setting signal RONN<0> are input to an input terminal of the second calculation circuit 452. From an output terminal of the second calculation circuit 452, a signal ZNDI<0> is output as the output signal of the NMOS output control circuit 45. As shown in FIG. 6, the signal ZNDI<4:0> is input to the N pre-driver 48<4:0>. The signal ZNDI<4:0> may be referred to as a drive signal to drive the N pre-driver 48<4:0>.

Figure 9:
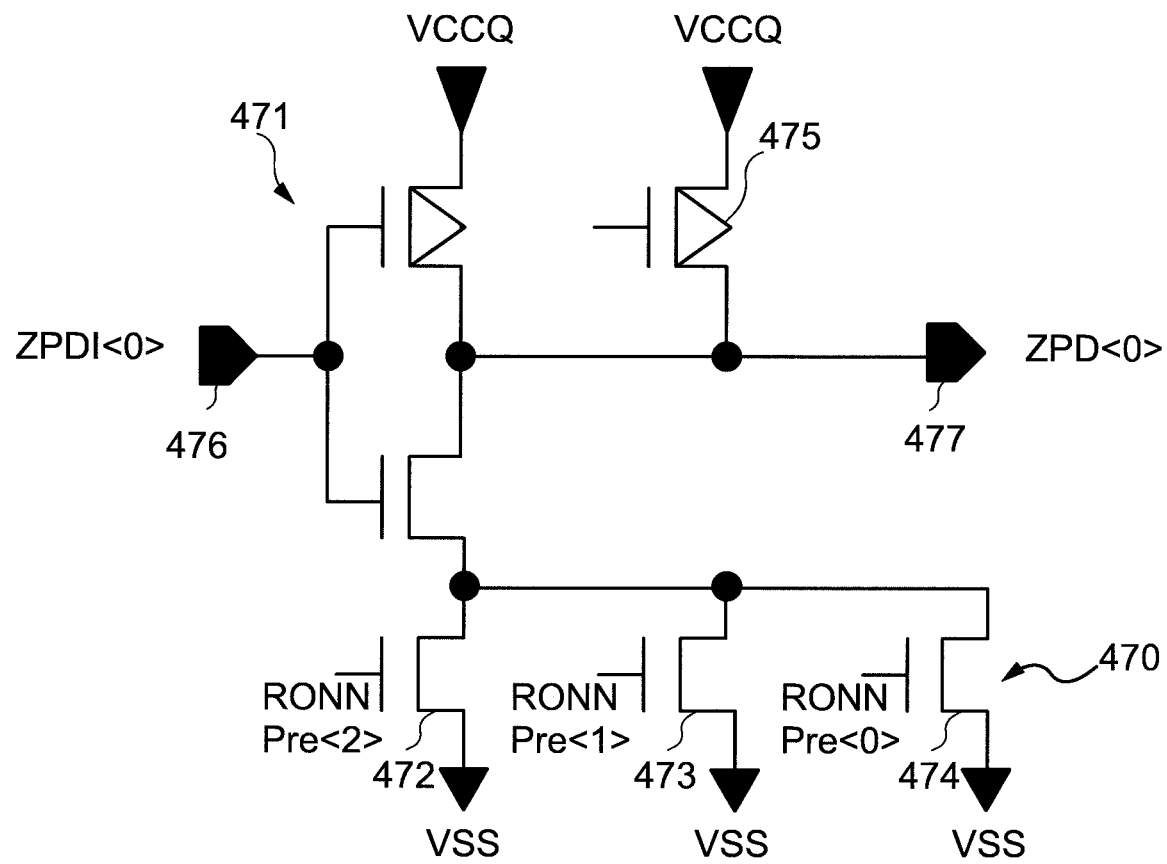
FIG. 9 is a block diagram for explaining a configuration of a P pre-driver circuit constituting an output circuit of a semiconductor storage device according to an embodiment.

FIG. 9 is a block diagram for explaining a configuration of a P pre-driver circuit constituting the output circuit of the semiconductor storage device according to an embodiment. In FIG. 9, the P pre-driver 47<0> is exemplified. However, the configuration of each of the other P pre-drivers 47<m> is also the same as the configuration of FIG. 9. As shown in FIG. 9, the P pre-driver 47<0> has a variable resistance transistor 470, an inverter 471 and a reset transistor 475.

The variable resistance transistor 470 is provided between the NMOS transistor of the inverter 471 and the ground voltage VSS. The variable resistance transistor 470 has NMOS transistors 472 to 474. The NMOS transistors 472 to 474 are connected in parallel between the NMOS transistors of the inverter 471 and the ground voltage VSS. The transistor sizes of the NMOS transistors 472 to 474 are different. For example, L lengths of each of the NMOS transistors 472 to 474 are the same, and a ratio of W length (472:473:474) is 4:2:1. Since on-resistances of each of the NMOS transistors 472 to 474 may be different, the W lengths of each of the NMOS transistors 472 to 474 may be the same, and the ratio of the L length (472:473:474) may be 1:2:4. The ratio of W length of the NMOS transistors 472 to 474 is not limited to the above ratio. The W lengths of the NMOS transistors 472 to 474 may be the same.

Gates of the NMOS transistors 472 to 474 are provided with the second setting signal RONNpre<2:0>. Specifically, the second setting signal RONNpre<2> is supplied to the gate of the NMOS transistor 472, the second setting signal RONNpre<1> is supplied to the gate of NMOS transistor 473, and the second setting signal RONNpre<0> is supplied to the gate of the transistor 474. As described above, since on-resistances of the NMOS transistors 472 to 474 are different, the resistance of the variable resistance transistor 470 is adjusted by the second setting signal RONNpre<2:0>.

The inverter 471 is provided between an input terminal 476 and an output terminal 477. The reset transistor 475 is a PMOS and is provided between the output terminal 477 and the supply voltage VCCQ. The inverter 471 may be referred to as a driver circuit. The variable resistance transistor 470 may be referred to be connected to one end of the driver circuit.

The P pre-driver 47<0> outputs the signal ZPD<0> in response to the input of the signal ZPDI<0>. The output-waveform of the signal ZPD<0> depends on the variable resistance transistor 470. Specifically, the inclination of the output-waveform of the signal ZPD<0> becomes steep in the case where the resistance of the variable resistance transistor 470 is smaller. The inclination of the output-waveform of the signal ZPD<0> becomes gentle in the case where the resistance of the variable resistance transistor 470 is larger. That is, the inclination of the output-waveform of the signal ZPD<0> is adjusted by the variable resistance transistor 470.

Figure 10:
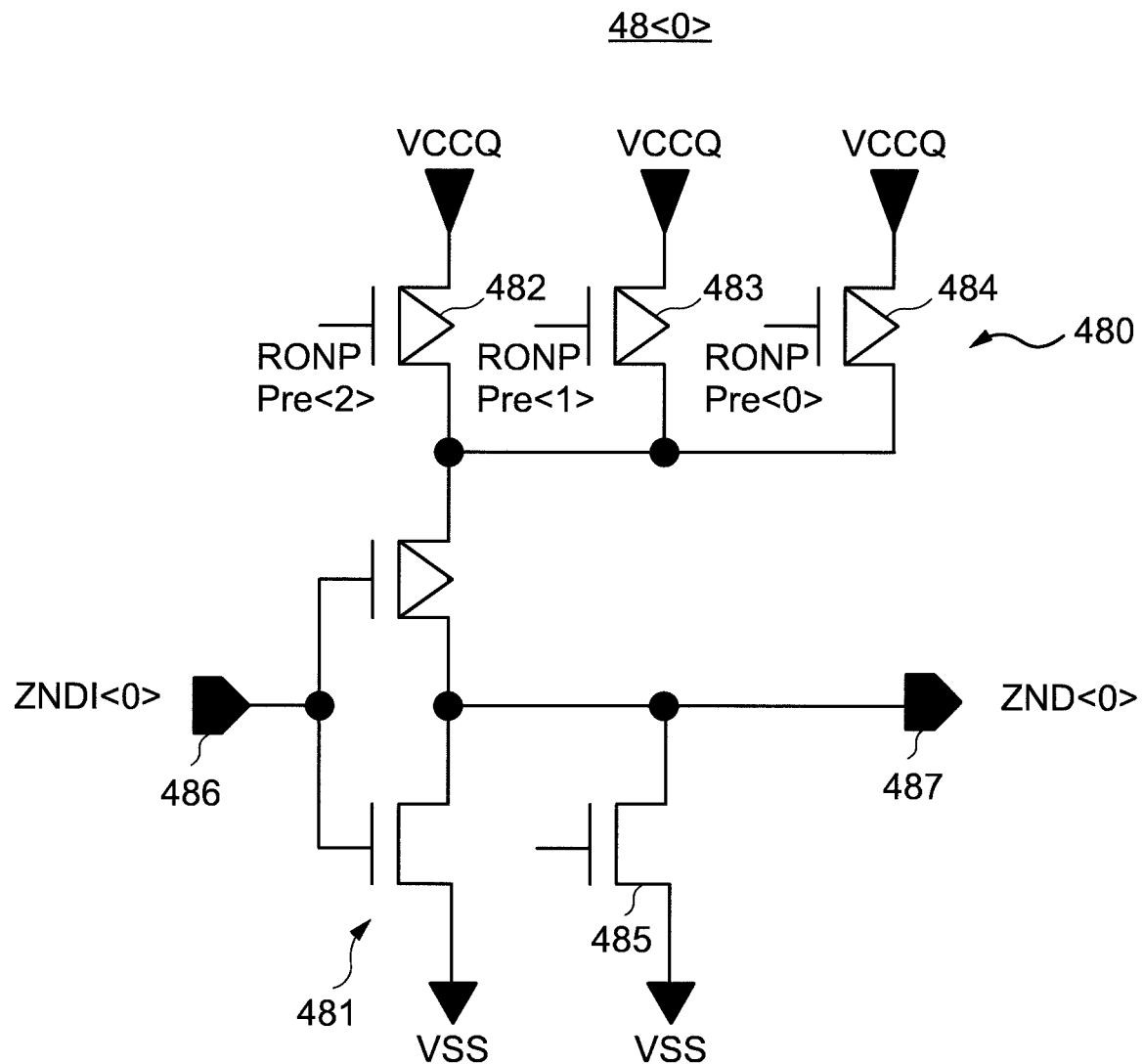
FIG. 10 is a block diagram for explaining a configuration of an N pre-driver circuit constituting an output circuit of a semiconductor storage device according to an embodiment.

FIG. 10 is a block diagram for explaining a configuration of an N pre-driver circuit constituting the output circuit of the semiconductor storage device according to an embodiment. In FIG. 10, the N pre-driver 48<0> is exemplified. However, the configuration of each of the other N pre-driver 48<m> is also the same configuration as in FIG. 10. As shown in FIG. 10, the N pre-driver 48<0> has a variable resistance transistor 480, an inverter 481 and a reset transistor 485.

The variable resistance transistor 480 is provided between the PMOS transistor of the inverter 481 and the supply voltage VCCQ. The variable resistance transistor 480 has PMOS transistors 482 to 484. The PMOS transistors 482 to 484 are connected in parallel between the PMOS transistor of the inverter 481 and the supply voltage VCCQ. The transistor sizes of the PMOS transistors 482 to 484 are different. For example, L lengths of each of the PMOS transistors 482 to 484 are the same, and the ratio of W length (482:483:484) is 4:2:1. Since on-resistance of each of the PMOS transistors 482 to 484 may be different, the W lengths of each of the PMOS transistors 482 to 484 may be the same, and the ratio of the L length (482:483:484) may be 1:2:4. The ratio of W length of the PMOS transistors 482 to 484 is not limited to the above ratio. The W length of the PMOS transistors 482 to 484 may be the same.

The second setting signals RONPpre<2:0> are supplied to gates of the PMOS transistors 482 to 484. Specifically, the second setting signal RONPpre<2> is supplied to the gate of the PMOS transistor 482, the second setting signal RONPpre<1> is supplied to the gate of the PMOS transistor 483, and the second setting signal RONPpre<0> is supplied to the gate of the transistor 484. As described above, since on-resistances of the PMOS transistors 482 to 484 are different, the resistance of the variable resistance transistor 480 is adjusted by the second setting signal RONPpre<2:0>.

The inverter 481 is provided between an input terminal 486 and an output terminal 487. The reset transistor 485 is a NMOS and is provided between the output terminal 487 and the ground voltage VSS. The inverter 481 may be referred to as a driver circuit. The variable resistance transistor 480 may be referred to be connected to one end of the driver circuit.

The N pre-driver 48<0> outputs a signal ZND<0> in response to the input of the signal ZNDI<0>. The output-waveform of the signal ZND<0> depends on the variable resistance transistor 480. Specifically, the inclination of the output-waveform of the signal ZND<0> becomes steep in the case where the resistance of the variable resistance transistor 480 is smaller. The inclination of the output-waveform of the signal ZND<0> becomes gentle in the case where the resistance of the variable resistance transistor 480 is larger. That is, the inclination of the output-waveform of the signal ZND<0> is adjusted by the variable resistance transistor 480.

Figure 11:
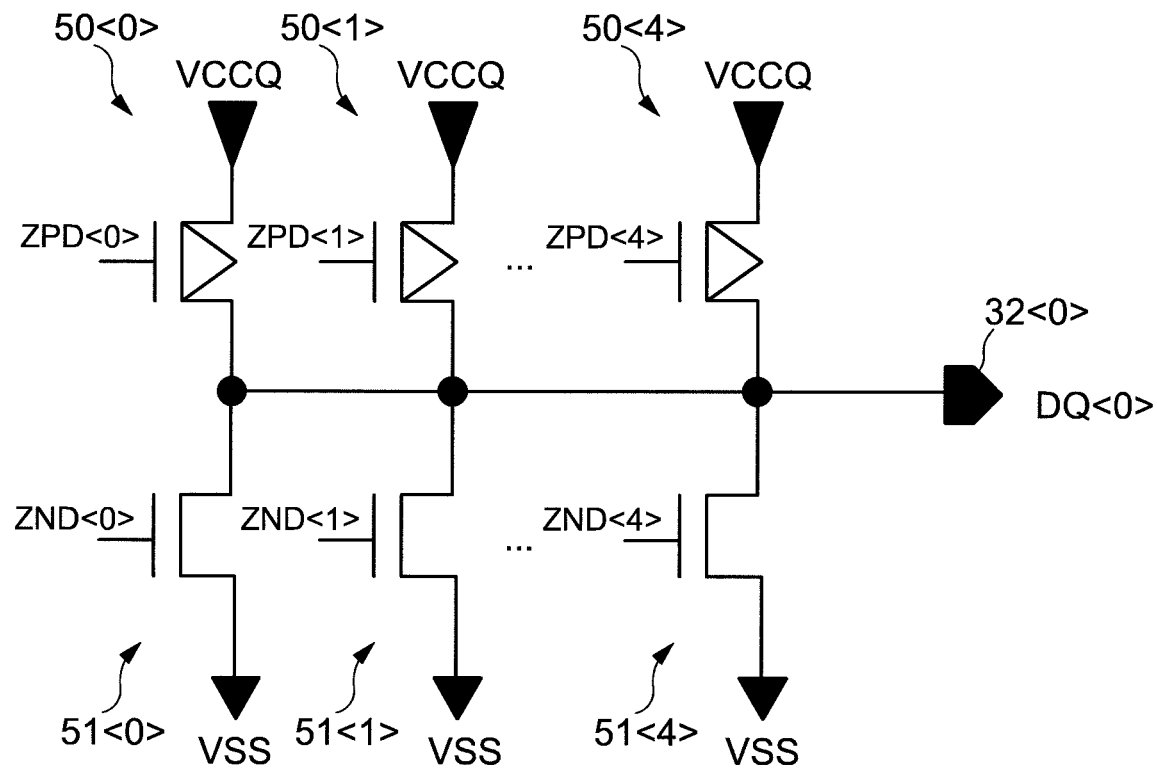
FIG. 11 is a block diagram for explaining a configuration of output buffers constituting an output circuit of a semiconductor storage device according to an embodiment.

FIG. 11 is a block diagram for explaining a configuration of the output buffer constituting the output circuit of the semiconductor storage device according to an embodiment. As shown in FIG. 11, the PMOS output buffer 50<4:0> and the NMOS output buffer 51<4:0> are connected to the pad 32<0>. The signals ZPD<4:0> are supplied to the gates of the PMOS output buffers 50<4:0>. The signals ZND<4:0> are supplied to the gates of the NMOS output buffers 51<4:0>. Therefore, the timing at which the signal is output from the PMOS output buffers 50<4:0> is controlled by the output-waveform of the above signals ZPD<4:0>. Similarly, the timing at which the signal is output from the NMOS output buffers 51<4:0> is controlled by the output-waveform of the above signals ZND<4:0>. That is, the timing of the output of the signal DQ<0> is adjusted by the variable resistance transistor 470 and the variable resistance transistor 480. The signal ZPD<4:0> may be referred to as a drive signal to drive the PMOS output buffers 50<4:0>. The signal ZND<4:0> may be referred to as a drive signal to drive the NMOS output buffers 51<4:0>. It may be referred that the PMOS output buffers 50<4:0> and the NMOS output buffers 51<4:0> drive the pad 32<0>.

As described above, the first setting signal RONP/the first setting signal RONN adjust an output resistance of the PMOS output buffer 50/the NMOS output buffer 51 (the first circuit). The second setting signal RONNpre/the second setting signal RONPpre adjust the output timings of the PMOS output buffer 50 and the NMOS output buffer 51.

The PMOS output buffer 50/the NMOS output buffer 51 have m pieces of the PMOS transistors 61/the NMOS transistors 62 (output transistor). In the present embodiment, m is 5, but is not limited to this value. The first setting signal RONP/the first setting signal RONN controls ON/OFF of each of the m PMOS transistors 61/the NMOS transistors 62.

The P pre-driver group 47/the N pre-driver group 48 (the second circuit) have m pieces of the P pre-drivers 47<m−1:0>/the N pre-drivers 48<m−1:0> for driving m pieces of the PMOS transistors 61<m−1:0>/the NMOS transistors 62<m−1:0> respectively (the driver circuit). The second setting signal RONNpre/the second setting signal RONPpre control the respective output waveforms of the m pieces of P pre-drivers 47/the N pre-drivers 48.

Each of m pieces of the P pre-drivers 47<m−1:0>/the N pre-drivers 48<m−1:0> includes the variable resistance transistor 470/the variable resistance transistor 480. The second setting signal RONNpre/the second setting signal RONPpre control the resistance in on-state of the variable resistance transistor 470/the variable resistance transistor 480.

[Calculation Processing of Calculation Circuit 90]

Figure 12:
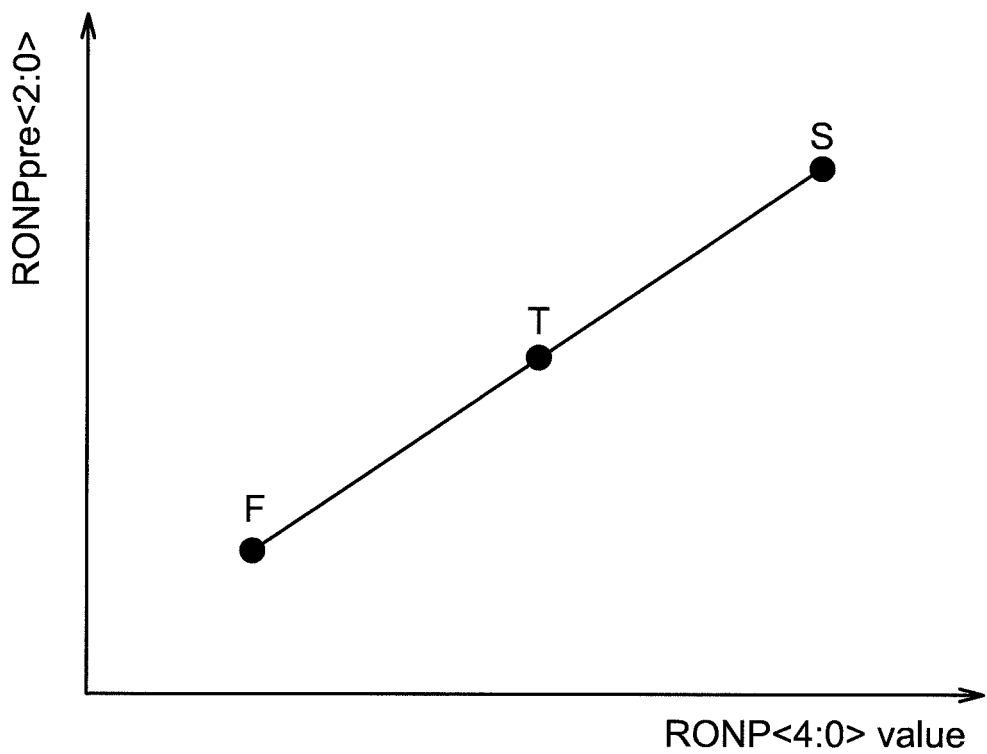
FIG. 12 is a diagram for explaining a calculation processing method of a calculation circuit of a semiconductor storage device according to an embodiment.
Figure 13:
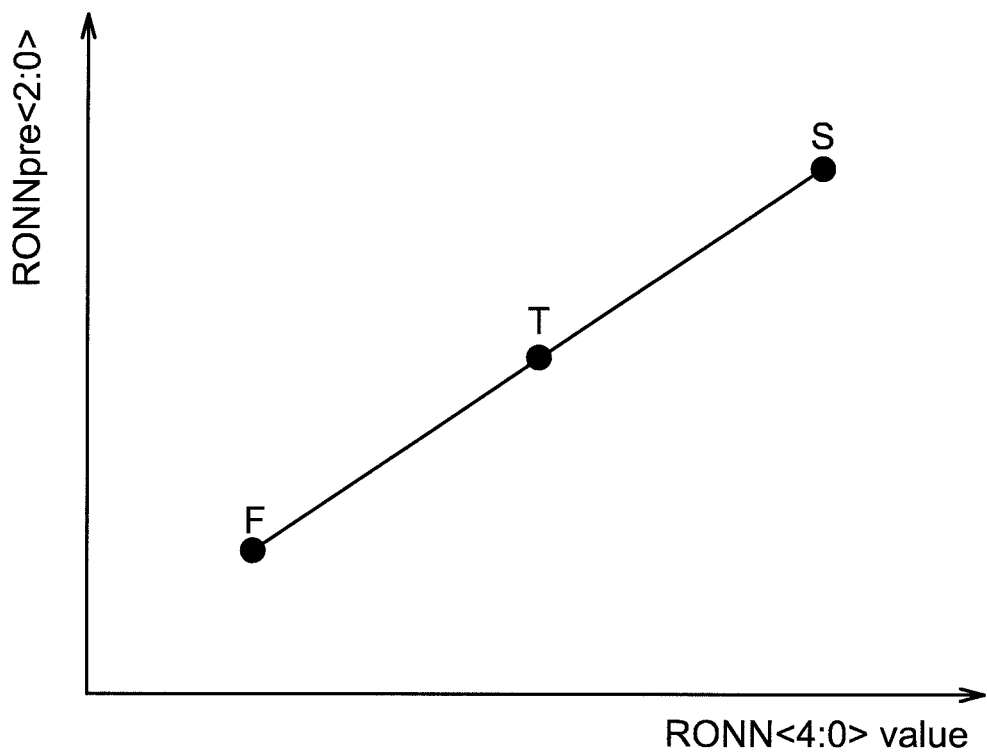
FIG. 13 is a diagram for explaining a calculation processing method of a calculation circuit of a semiconductor storage device according to an embodiment.

A calculation processing method of the calculation circuit 90 will be described with reference to FIGS. 12 and 13. In FIG. 12 and FIG. 13, T (Typical) condition is a reference condition. S (Slow) condition is a condition in which the on characteristic of the MOS is lower than the on characteristic of the reference condition (e.g., higher threshold or lower on-current). F (Fast) condition is a condition in which the on characteristic of the MOS is higher than the on characteristic of the reference condition, (e.g., lower threshold or larger on-current). The "RONP<4:0> value" shown in FIG. 12 is a value relating to on-resistance of the PMOS output buffer 50<4:0> to be determined based on the RONP<4:0>. That is, it means that the larger "RONP<4:0> value", the smaller the combined resistance of the PMOS output buffer 50<4:0>. Similarly, it means that the larger "RONPpre<2:0>", the smaller the combined resistance of the variable resistance transistor 480 of the N pre-driver 48<m>.

Similar to the above, the "RONN<4:0> value" shown in FIG. 13 is a value relating to on-resistance of the NMOS output buffer 51<4:0> to be determined based on the RONN<4:0>. That is, it means that the larger "RONN<4:0> value", the smaller the combined resistance of the NMOS output buffer 51<4:0>. Similarly, it means that the larger "RONNpre<2:0>", the smaller the combined resistance of the variable resistance transistor 470 of the P pre-driver 47<m>.

The RONP<4:0> is generated by the Ron conversion logic circuit 42. It means that the larger "RONP<4:0> value", the lower the on characteristic of the entire PMOS of the output circuit 222. Therefore, since the on characteristic of the PMOS of the N pre-driver 48 for driving the NMOS output buffer 51<4:0> is low, the timing at which the signal is output from the NMOS output buffer 51<4:0> is delayed from the reference timing. On the other hand, it means that the smaller "RONP<4:0> value", the higher on characteristic of the entire PMOS of the output circuit 222. Therefore, since the on characteristic of the PMOS of the N pre-driver 48 for driving the NMOS output buffer 51<4:0> is high, the timing at which the signal is output from the NMOS output buffer 51<4:0> is earlier than the reference timing. Thus, a variation occurs in the slew rate of the NMOS output buffer 51<4:0> in conjunction with the "RONP<4:0> value". Similarly, a variation occurs in the slew rate of the PMOS output buffer 50<4:0> in conjunction with the "RONN<4:0> value". The calculation circuit 90 suppresses the variation in the slew rate by calculating an appropriate "RONPpre<2:0>" based on the "RONP<4:0> value", and an appropriate "RONNpre<2:0>" based on the "RONN<4:0> value" as described below.

The calculation circuit 90 performs a calculation based on a calculation formula that outputs values based on each of the first setting signal RONP<4:0> and the RONN<4:0> to be input as variable. The calculation formula is calculated in advance by simulation. For example, as shown in FIG. 12, the calculation formula may be a calculation formula in which the relationship between the "RONP<4:0> value" and "RONPpre<2:0>" is linear. Similarly, as shown in FIG. 13, the calculation formula may be a calculation formula in which the relationship between the "RONN<4:0> value" and "RONNpre<2:0>" is linear.

As shown in FIG. 12, the "RONP<4:0> value" in the S condition is larger than the "RONP<4:0> value" in the T condition. That is, it means that the on characteristic of the entire PMOS of the output circuit 222 is lower in the S condition. Based on the characteristics, by increasing the value of the "RONPpre<2:0>" output by the calculation circuit 90 than the "RONPpre<2:0>" of the T condition, reduction in drive capacity of the N pre-driver 48<4:0> is suppressed. This reduces the variation in the slew rate of the NMOS output buffer 51<4:0> due to the decrease in the capability of the N pre-driver 48<4:0>. Similarly, the "RONP<4:0> value" in the F condition is smaller than the "RONP<4:0> value" in the T condition. That is, it means that the on characteristic of the entire PMOS of the output circuit 222 is higher in the F condition. Based on the characteristics, by reducing the value of the "RONPpre<2:0>" output by the calculation circuit 90 than the "RONPpre<2:0>" of the T condition, excess of the drive capacity of the N pre-driver 48<4:0> is suppressed. This reduces the variation in the slew rate of the NMOS output buffer 51<4:0> due to the exceeding in the capability of the N pre-driver 48<4:0>. In this manner, the variation in the slew rate caused by the on characteristic variation of the MOS caused by the process variation or the like is suppressed.

[Operation Flow of Slew Rate Adjustment]

Figure 14:
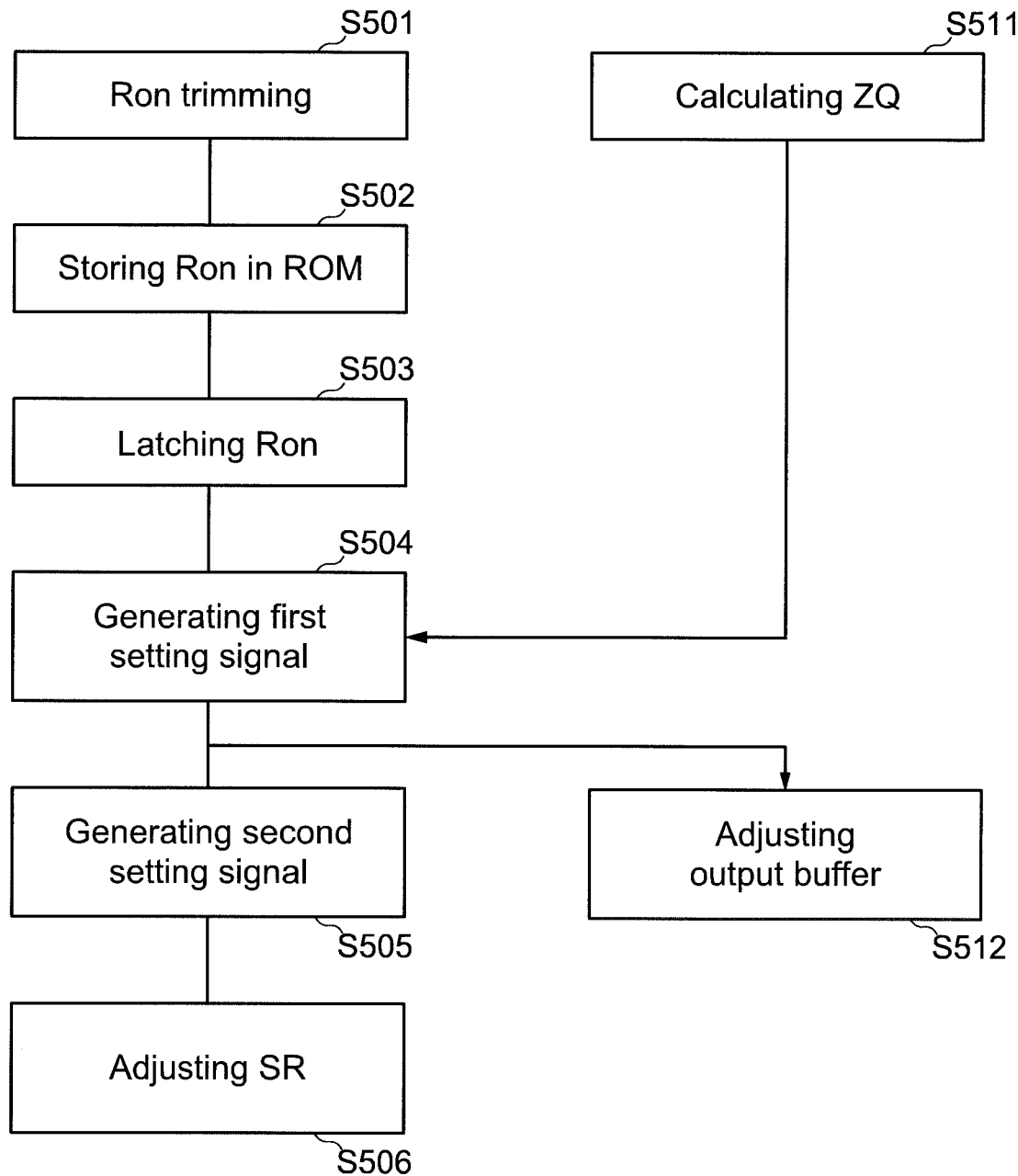
FIG. 14 is an operation flow for adjusting slew rate of a semiconductor storage device according to an embodiment.

FIG. 14 is an operation flow for adjusting slew rate of the semiconductor storage device according to an embodiment. As shown in FIG. 14, firstly, Ron trimming is performed (step S501; Ron trimming). Then, the Ron information is stored in the memory cell array 21 (ROM) (step S502; Storing Ron in ROM). Subsequently, the Ron_DAC register 41 temporarily stores (latches) the Ron information (the signal RONPorg<4:0> and the signal RONNorg<4:0>) stored in the memory cell array 21 (step S503; Latching Ron). In parallel with the above operation, the ZQ calibration circuit 23 calculates the ZQ information (step S511; Calculating ZQ). In response to the Ron setting information and the ZQ information, the Ron conversion logic circuit 42 converts the signal RONPorg<4:0> received from the Ron_DAC register 41 to generate the first setting signal RONP<4:0> (step S504; Generating first setting signal).

The PMOS output control circuit 44/the NMOS output control circuit 45 adjust on resistances of the PMOS output buffer group 50/the NMOS output buffer group 51 based on the first setting signal RONP<4:0>/the first setting signal RONN<4:0> (step S512; Adjusting output buffer). In parallel with the step S512, the calculation circuit 90 generates the second setting signal RONPpre<2:0>/the second setting signal RONNpre<2:0> based on the first setting signal RONP<4:0>/the first setting signal RONN<4:0>, transmits the second setting signal RONPpre<2:0> to the P pre-driver 47<4:0>, and transmits the second setting signal RONPpre<2:0> to the N pre-driver 48<4:0> (step S505; Generating second setting signal). Slew rate of the output buffer 49 is adjusted by adjusting the P pre-driver 47<4:0>/the N pre-driver 48<4:0> in step S505 (step S506; Adjusting SR).

As described above, according to the output circuit 222 in the first embodiment, the second setting signal RONPpre<2:0> and the RONNpre<2:0> are generated based on the first setting signal RONP<4:0> and RONN<4:0> output from the Ron conversion logic circuit 42<4:0>. The slew rate of the PMOS output buffer group 50 is adjusted by the generated second setting signal RONNpre<2:0>. The RONPpre<2:0> adjusts the slew rate of the NMOS output buffer group 51. Therefore, even if there is the on characteristic variation of PMOS, NMOS used in the circuit due to a variation in the manufacturing process of the semiconductor storage device, the slew rate is adjusted to compensate for the variation.

That is, the slew rate is adjusted by automatically changing the circuit constant internally.

In the present embodiment, a configuration in which the five P pre-drivers 47, the five N pre-drivers 48, the five PMOS output buffers 50 and the five NMOS output buffers 51 are provided is exemplified, but the present invention is not limited to this configuration. The number of these drivers and buffers may be 4 or less and may be 6 or more. In the present embodiment, the configuration in which the three NMOS transistors included in the P pre-driver 47 (the variable resistance transistor) and the three PMOS transistors included in the N pre-driver (the variable resistance transistor) are provided has been exemplified, but the present invention is not limited to this configuration. The number of each variable resistance transistor may be two or may be four or more.

Second Embodiment

Figure 15:
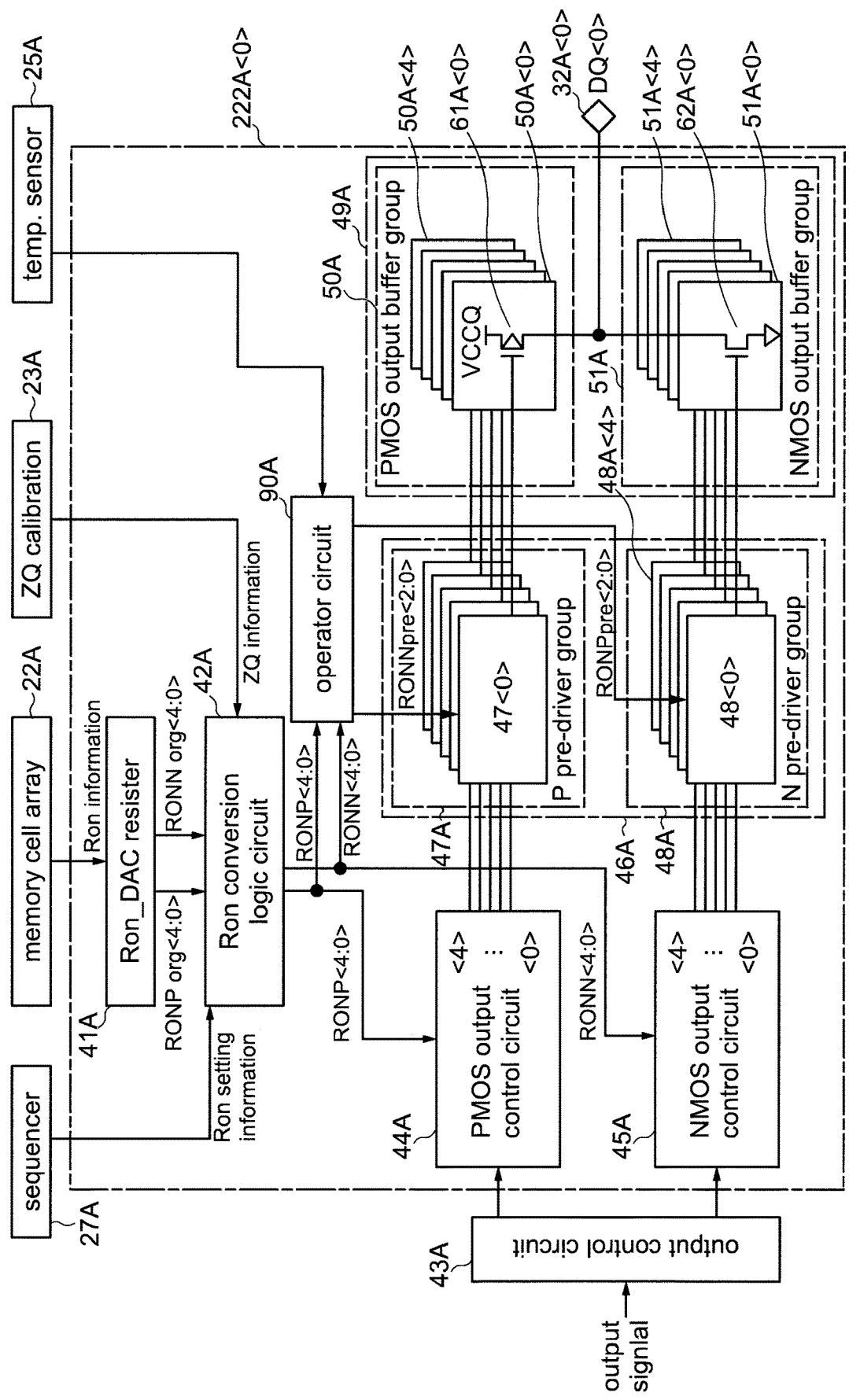
FIG. 15 is a block diagram for explaining a configuration of an output circuit of a semiconductor storage device according to an embodiment.

The memory system according to the second embodiment will be described with reference to FIG. 15. FIG. 15 is a block diagram for explaining a configuration of an output circuit of the semiconductor storage device according to an embodiment. An output circuit 222A shown in FIG. 15 is similar to the output circuit 222 shown in FIG. 5. However, in that the information from a temperature sensor 25A is input to a calculation circuit 90A, it is different from the output circuit 222. In the following description, descriptions of the same features as those of the configuration of FIG. 5 are omitted, and points mainly different from those of the configuration of FIG. 5 will be described.

[Configuration of Output Circuit]

As shown in FIG. 15, the calculation circuit 90A is connected to the temperature sensor (temp. sensor) 25A. A temperature code is input from the temperature sensor 25A to the calculation circuit 90A. The temperature code is a code generated based on the temperature measured by the temperature sensor 25A. For example, a temperature code "00" is input to the calculation circuit 90A when the temperature measured by the temperature sensor 25A is less than 0° C., a temperature code "01" is input to the calculation circuit 90A when the temperature is 0° C. or more and less than 45° C., a temperature code "10" is input to the calculation circuit 90A when the temperature is 45° C. or more and less than 85° C., and a temperature code "11" is input to the calculation circuit 90A when the temperature is 85° C. or more.

The calculation circuit 90A performs temperature compensation based on the temperature code output from the temperature sensor 25A with respect to the second setting signal RONPpre<2:0> and the RONNpre<2:0> generated based on the first setting signal RONP<4:0> and the RONN<4:0> output from a Ron-conversion logic circuit 42A. Specifically, based on the temperature code, the values of the second setting signal RONPpre<2:0> and the RONNpre<2:0> calculated by FIGS. 12 and 13 are increased or decreased.

For example, when the above temperature code is "00", since the on characteristic of the MOS is improved in a low temperature environment, the value of the second setting signal is decremented by one. That is, in the above case, the value of the second setting signals RONPpre<2:0> and the RONNpre<2:0> are reduced in order to increase on-resistances of a PMOS output buffer 50A and an NMOS output buffer 51A. When the above temperature code is 01, since the current temperature is within the range of the standard use temperature, the second setting signal is used as it is.

When the above temperature code is 10, since the on characteristic of the MOS is lowered in a high temperature environment, the value of the second setting signal is incremented by one. That is, in the above case, the value of the second setting signals RONPpre<2:0> and RONNpre<2:0> is increased in order to reduce on-resistances of the PMOS output buffer 50A and the NMOS output buffer 51A. When the above temperature code is 11, since the on characteristic of the MOS is further reduced than the above, the value of the second setting signals is incremented by two.

As described above, according to the output circuit 222A of the second embodiment, the variation in slew rate due to the on characteristic variation of the MOS caused by the temperature is suppressed.

In the above embodiment, a configuration in which the temperature measured by the temperature sensor 25A is coded is exemplified, the coding may be performed by the calculation circuit 90A.

Third Embodiment

Figure 16:
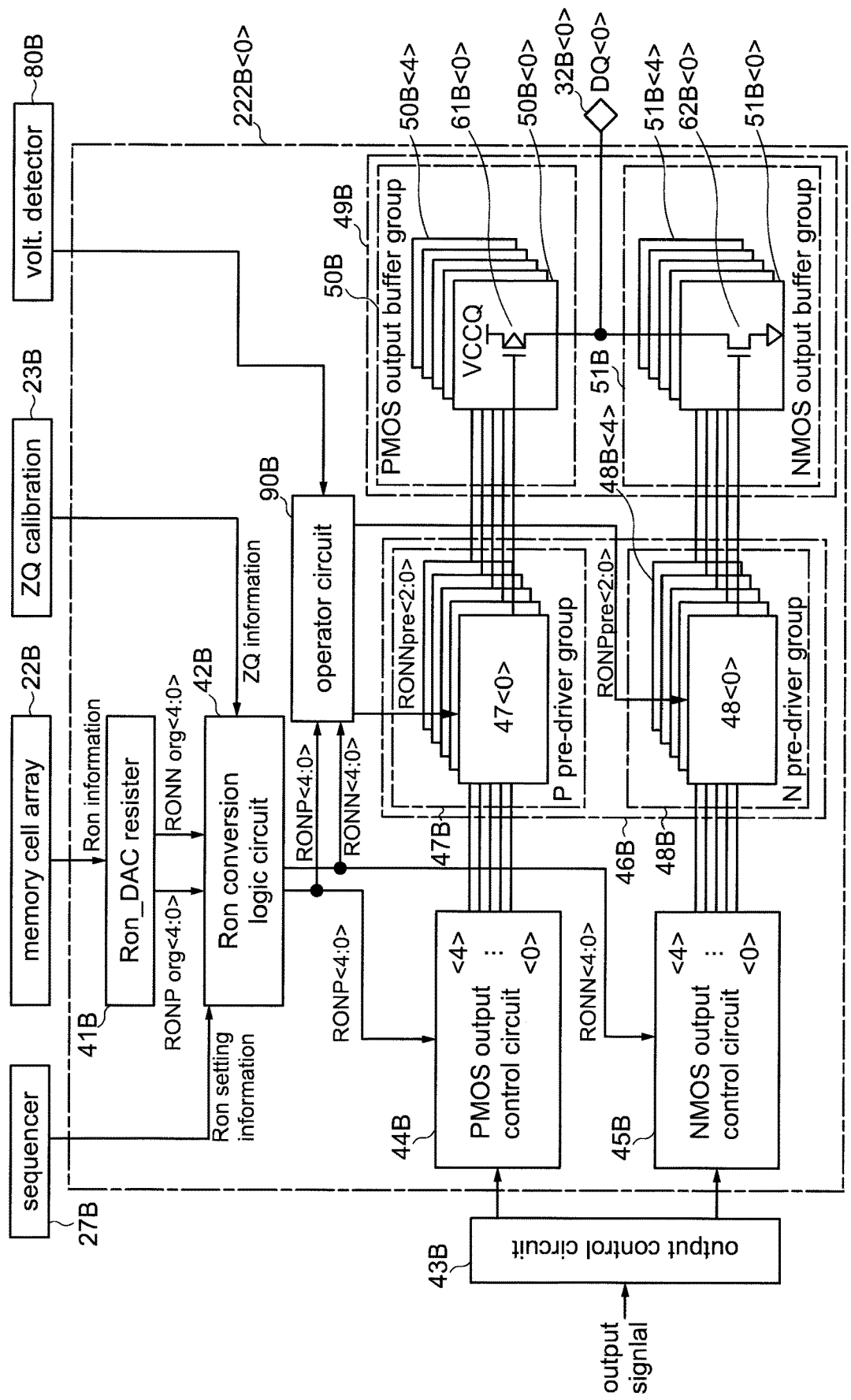
FIG. 16 is a block diagram for explaining a configuration of an output circuit of a semiconductor storage device according to an embodiment.

A memory system according to the third embodiment will be described with reference to FIG. 16. FIG. 16 is a block diagram for explaining a configuration of an output circuit of the semiconductor storage device according to an embodiment. An output circuit 222B shown in FIG. 16 is similar to the output circuit 222 shown in FIG. 5. However, it differs from the output circuit 222 in that a supply voltage detection circuit 80B is provided in each of the semiconductor storage devices 5 to 8 and information from the supply voltage detection circuit 80B is input to a calculation circuit 90B. In the following description, descriptions of the same features as those of the configuration of FIG. 5 are omitted, and points mainly different from those of the configuration of FIG. 5 will be described.

[Configuration of Output Circuit]

As shown in FIG. 16, the calculation circuit 90B is connected to the supply voltage detection circuit (volt. detector) 80B. A voltage code is input from the supply voltage detection circuit 80B to the calculation circuit 90B. The voltage code is a code generated based on the supply voltage VCCQ of the output circuit 222B measured by the supply voltage detection circuit 80B. The supply voltage VCCQ is a voltage commonly supplied to, for example, the PMOS output buffer 50/the NMOS output buffer 51 and the P pre-driver 47/the N pre-driver 48. For example, when the supply voltage VCCQ measured by the supply voltage detection circuit 80B is less than 1.15V, a voltage code "00" is input to the calculation circuit 90B, when the supply voltage VCCQ is 1.15V or more and less than 1.25V, a voltage code "01" is input to the calculation circuit 90B, when the supply voltage VCCQ is 1.25V or more and less than 1.3V, a voltage code "10" is input to the calculation circuit 90B, and when the supply voltage VCCQ is 1.3 or more, a voltage code "11" is input to the calculation circuit 90B.

The calculation circuit 90B performs voltage correction based on the voltage code output from the supply voltage detection circuit 80B with respect to the second setting signals RONPpre<2:0> and the RONNpre<2:0> generated based on the first setting signals RONP<4:0> and the RONN<4:0> output from a Ron conversion logic circuit 42B. Specifically, based on the voltage code, the values of the second setting signals RONPpre<2:0> and the RONNpre<2:0> calculated by FIGS. 12 and 13 are increased or decreased.

For example, when the above voltage code is "00", since the on characteristic of the MOS is lowered due to the lower supply voltage VCCQ, the values of the second setting signals are incremented by one. That is, in the above case, the value of the second setting signals RONPpre<2:0> and the RONNpre<2:0> are increased in order to reduce on-resistances of a PMOS output buffer 50B and an NMOS output buffer 51B. When the above voltage code is "01", the second setting signal is used as it is because the present voltage is within the typical supply voltage VCCQ. When the above voltage code is "10", since the on characteristic of the MOS is improved due to the high supply voltage VCCQ, the values of the above second setting signals are decremented by one. That is, in the above case, the values of the second setting signals RONPpre<2:0> and RONNpre<2:0> are reduced in order to increase on-resistances of the PMOS output buffer 50B and the NMOS output buffer 51B. When the above voltage code is "11", since the on characteristic of the MOS is further improved than the above, the values of the above second setting signals are decremented by two.

As described above, according to the output circuit 222B of the third embodiment, the variation in slew rate due to the on characteristic variation of the MOS caused by the supply voltage VCCQ is suppressed.

In the above-described embodiment, the configuration that encodes the supply voltage VCSQ measured by the supply voltage detection circuit 80B is exemplified, but the coding may be performed by the calculation circuit 90B.

While the present invention has been described with reference to the drawings, the present invention is not limited to the above embodiments and can be appropriately modified without departing from the spirit of the present invention. For example, an output circuit of the present embodiment to which a person skilled in the art adds, deletes, or changes the design of components as appropriate based on the output circuit of the present embodiment is also included in the scope of the present invention as long as the gist of the present invention is provided. Furthermore, the embodiments described above can be appropriately combined as long as there is no mutual inconsistency, and technical matters common to the embodiments are included in the embodiments even if they are not explicitly described.

Even if it is other working effects which is different from the working effect brought about by the mode of each above-mentioned embodiment, what is clear from the description in this description, or what can be easily predicted by the person skilled in the art is naturally understood to be brought about by the present invention.

What is claimed is:

1. A semiconductor storage device comprising:
   an output pad;
   a first circuit connected to the output pad;
   a second circuit connected to the first circuit;
   a third circuit configured to output a first setting signal for controlling the first circuit in accordance with a characteristic variation of the first circuit; and
   a fourth circuit configured to generate a second setting signal for controlling the second circuit in accordance with the first setting signal received from the third circuit and output the second setting signal to the second circuit.

2. The semiconductor storage device according to claim 1, wherein the second circuit controls the first circuit.

3. The semiconductor storage device according to claim 1, wherein
   the first setting signal adjusts an output resistance of the first circuit, and
   the second setting signal adjusts an output timing of the first circuit.

4. The semiconductor storage device according to claim 1, further comprising a temperature sensor,
   wherein the fourth circuit adjusts the second setting signal based on information related to a temperature output from the temperature sensor.

5. The semiconductor storage device according to claim 1, further comprising a detection circuit configured to detect a supply voltage, a voltage having the same magnitude with the supply voltage being supplied to the first circuit,
   wherein the fourth circuit adjusts the second setting signal based on information related to the supply voltage output from the detection circuit.

6. The semiconductor storage device according to claim 1, wherein
   the first circuit has m output transistors (m is a natural number), and
   the first setting signal controls ON/OFF of each of the m output transistors.

7. The semiconductor storage device according to claim 6, wherein
   the second circuit has m driver circuits configured to drive the m output transistors, respectively, and
   the second setting signal controls an output waveform of each of the m driver circuits.

8. The semiconductor storage device according to claim 7, wherein
   each of the m output transistors includes a variable resistance transistor, and
   the second setting signal controls a resistance of the variable resistance transistor in ON state.

9. The semiconductor storage device according to claim 1, further comprising
   a fifth circuit connected to the second circuit, wherein
   the fifth circuit drives the second circuit in accordance with output-subject data and the first setting signal,
   the second circuit drives the first circuit in accordance with a first drive signal from the fifth circuit and the second setting signal, and
   the first circuit drives the output pad in accordance with a second drive signal from the second circuit.

10. The semiconductor storage device according to claim 9, wherein
    each of the output pad, the first circuit, the second circuit and the fifth circuit is provided in plurality,
    the first circuits are connected to the output pads, respectively,
    the second circuits are connected to the first circuits, respectively, and
    the fifth circuits are connected to the second circuits, respectively.

11. The semiconductor storage device according to claim 10, wherein
    each of the fifth circuits includes
    a first NAND gate which receive a corresponding one of the output-subject data and a timing control signal, and
    a second NAND gate which receive an output signal from the first NAND gate and a corresponding one of the first setting signals, and output the first drive signal to the second circuit.

12. The semiconductor storage device according to claim 11, wherein
    each of the second circuits includes
    a driver circuit configured to output the second drive signal to the first circuit, and a variable resistance transistor connected to one end of the driver circuit and configured to receive the second control signal.

13. The semiconductor storage device according to claim 10, further comprising a memory cell array including a plurality of memory cells,
wherein the firth circuits are driven in accordance with data read out from the memory cells, respectively.

14. The semiconductor storage device according to claim 13, further comprising a temperature sensor configured to output a temperature corresponding to a temperature of the memory cell array,
wherein the fourth circuit adjusts the second setting signal based on a temperature code output from the temperature sensor.

* * * * *